United States Patent
Janjua et al.

(10) Patent No.: US 12,087,361 B2
(45) Date of Patent: Sep. 10, 2024

(54) MEMORY DEVICE AND OPERATING METHOD THEREOF

(71) Applicant: SAMSUNG ELECTRONICS CO., LTD., Suwon-si (KR)

(72) Inventors: Bilal Ahmad Janjua, Suwon-si (KR); Jongryul Kim, Dangjin-si (KR); Venkataramana Gangasani, Suwon-si (KR); Jungyu Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/177,320

(22) Filed: Mar. 2, 2023

(65) Prior Publication Data

US 2023/0207007 A1    Jun. 29, 2023

Related U.S. Application Data

(63) Continuation of application No. 16/871,481, filed on May 11, 2020, now Pat. No. 11,615,841.

(30) Foreign Application Priority Data

Oct. 22, 2019    (KR) .................. 10-2019-0131416

(51) Int. Cl.
*G11C 13/00* (2006.01)
*H10B 63/00* (2023.01)
*H10N 70/00* (2023.01)
*H10N 70/20* (2023.01)

(52) U.S. Cl.
CPC ...... *G11C 13/0069* (2013.01); *G11C 13/0004* (2013.01); *G11C 13/0026* (2013.01);
(Continued)

(58) Field of Classification Search
CPC ............ G11C 13/0069; G11C 13/0004; G11C 13/0026; G11C 13/0028; G11C 13/003;
(Continued)

(56) References Cited

U.S. PATENT DOCUMENTS 7,916,524 B2    3/2011  Happ et al.
7,974,122 B2 *  7/2011  Lin .................... G11C 13/0069
                                                        365/163
(Continued)

FOREIGN PATENT DOCUMENTS

KR    10-2014-0128492 A    11/2014
KR    10-2017-0078649 A    7/2017

OTHER PUBLICATIONS

Office Action dated Nov. 27, 2023 in corresponding Korean Patent Application No. 10-2019-0131416 (in Korean), 4 pages.
(Continued)

*Primary Examiner* — Xiaochun L Chen
(74) *Attorney, Agent, or Firm* — F. CHAU & ASSOCIATES, LLC

(57) ABSTRACT

A memory device includes a plurality of memory cells, each including a switching device and an information storage device connected to the switching device and having a phase change material, the plurality of memory cells connected to a plurality of word lines and a plurality of bit lines, a decoder circuit determining at least one of the plurality of memory cells to be a selected memory cell, and a program circuit configured to input a programming current to the selected memory cell to perform a programming operation and configured to detect a resistance of the selected memory cell to adjust a magnitude of the programming current.

20 Claims, 23 Drawing Sheets

(52) U.S. Cl.
CPC ........ *G11C 13/0028* (2013.01); *G11C 13/003* (2013.01); *G11C 2013/0078* (2013.01); *G11C 2213/71* (2013.01); *G11C 2213/72* (2013.01); *H10B 63/24* (2023.02); *H10B 63/84* (2023.02); *H10N 70/231* (2023.02); *H10N 70/8413* (2023.02); *H10N 70/8828* (2023.02)

(58) Field of Classification Search
CPC ........ G11C 2013/0078; G11C 2213/71; G11C 2213/72; G11C 2013/0076; G11C 2013/0092; G11C 2213/15; G11C 13/0061; G11C 13/0023; G11C 13/0038; H10B 63/24; H10B 63/84; H10N 70/231; H10N 70/8413; H10N 70/8828; H10N 70/826
See application file for complete search history.

(56) References Cited

U.S. PATENT DOCUMENTS

| | | | |
|---|---|---|---|
| 8,199,561 B2 * | 6/2012 | Sheu | G11C 13/0004 365/158 |
| 8,325,535 B2 | 12/2012 | Sonehara | |
| 9,218,876 B2 | 12/2015 | Spessot et al. | |
| 9,343,149 B2 | 5/2016 | Pirovano et al. | |
| 9,355,721 B2 | 5/2016 | Yoon et al. | |
| 9,892,785 B2 | 2/2018 | Rangan et al. | |
| 2004/0246804 A1 | 12/2004 | Cho et al. | |
| 2010/0165720 A1 | 7/2010 | Lin et al. | |
| 2011/0069538 A1 | 3/2011 | Lam et al. | |
| 2013/0336054 A1 | 12/2013 | Parkinson | |
| 2014/0146596 A1 | 5/2014 | Liu | |
| 2014/0321195 A1 | 10/2014 | Antonyan | |
| 2016/0042788 A1 | 2/2016 | Ahn et al. | |
| 2017/0092356 A1 | 3/2017 | Wu | |
| 2017/0243642 A1 | 8/2017 | Muralimanohar et al. | |
| 2018/0190333 A1 | 7/2018 | Jefremow et al. | |
| 2018/0358085 A1 | 12/2018 | Em et al. | |
| 2021/0118502 A1 | 4/2021 | Janjua et al. | |

OTHER PUBLICATIONS

Notice of Allowance dated Apr. 5, 2024 in corresponding Korean Patent Application No. 10-2019-0131416, in Korean, 3 pages.

* cited by examiner

MEMORY DEVICE AND OPERATING METHOD THEREOF

CROSS-REFERENCE TO RELATED APPLICATIONS

This application is a continuation under 35 U.S.C. 120 of U.S. patent application Ser. No. 16/871,481, filed in the United States Patent and Trademark Office on May 11, 2020, which claims the benefit under 35 USC 119(a) of Korean Patent Application No. 10-2019-0131416 filed on Oct. 22, 2019 in the Korean Intellectual Property Office, the entire disclosures of which are incorporated herein by reference for all purposes.

TECHNICAL FIELD

The present disclosure relates generally to memory devices and operating methods thereof, and more particularly to memory devices that employ a resistor.

DISCUSSION OF THE RELATED ART

Traditional memory devices write data by charging or discharging electrical charges. Memory devices using a resistor differ by writing or erasing data using a change in resistance.

Some examples of memory devices using a resistor include a phase change random access memory (PRAM), a resistive random access memory (RRAM), and a magnetic RAM (MRAM).

SUMMARY

In an aspect of the present inventive concept, a memory device capable of improving program characteristics is provided.

According to an aspect of the present inventive concept, a memory device includes a plurality of memory cells, each including a switching device and an information storage device connected to the switching device and having a phase change material, the plurality of memory cells connected to a plurality of word lines and a plurality of bit lines, a decoder circuit determining at least one of the plurality of memory cells to be a selected memory cell, and a program circuit configured to apply a programming current to the selected memory cell to perform a programming operation, and configured to detect a resistance of the selected memory cell to adjust a magnitude of the programming current.

According to an aspect of the present inventive concept, a memory device includes a memory cell array including a plurality of memory cells disposed at locations at which a plurality of word lines and a plurality of bit lines intersect each other, a decoder circuit determining at least one of the plurality of memory cells to be a selected memory cell, and a program circuit generating a sampling current of which a magnitude decreases as resistance of the selected memory cell increases during a sampling period, and generating a programming current based on the sampling current during a programming period, in a programming operation for the selected memory cell.

According to an aspect of the present inventive concept, a method of operating a memory device includes turning on a selected memory cell connected to a selected word line and a selected bit line, detecting a resistance of the selected memory cell, inputting a bias current to a selected word line connected to the selected memory cell and generating an initial programming current corresponding to the bias current, generating an additional programming current of which a magnitude decreases as the detected resistance increases, and programming the selected memory cell using the initial programming current and the additional programming current.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
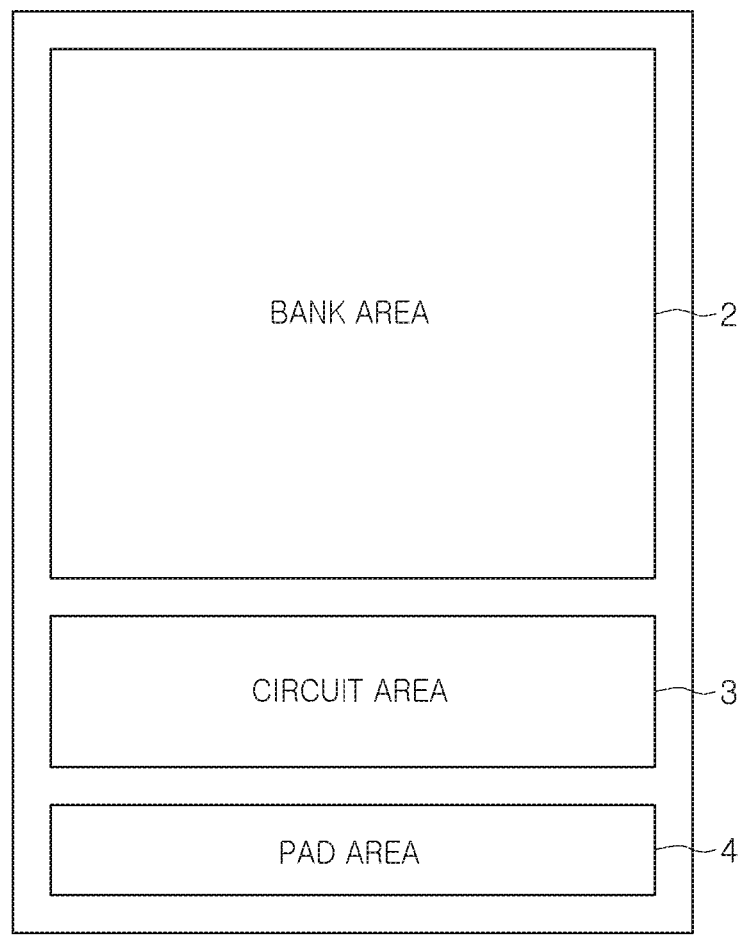
FIG. 1 is a schematic plan view of a a memory device according to an example embodiment.

FIG. 1 is a schematic plan view of a memory device 1 according to an example embodiment. The memory device 1 may have a bank area 2, a circuit area 3, and a pad area 4. The pad area 4 may be an area in which a plurality of pads for inputting and outputting control signals and data are formed. The circuit area 3 may be an area in which various circuits used for the operation of the memory device 1 are formed. In the bank area 2, memory cell arrays having a plurality of memory cells may be formed. The memory cell arrays may be organized in a plurality of banks.

Each of the plurality of banks formed in the bank area 2 may be divided into a plurality of areas. For example, at least a portion of the plurality of regions dividing each of the plurality of banks may share a decoder circuit and/or a read/write circuit included in the circuit area 3. Alternative arrangements may also be available.

The circuit area 3 may include a decoder circuit, a read/write circuit, a control logic controlling the decoder circuit and the read/write circuit, and the like. The decoder circuit may determine at least one of the plurality of memory cells formed in the bank area 2 to be a selected memory cell in response to an address. The read/write circuit may read data from, or write data to, the selected memory cell.

Figure 2:
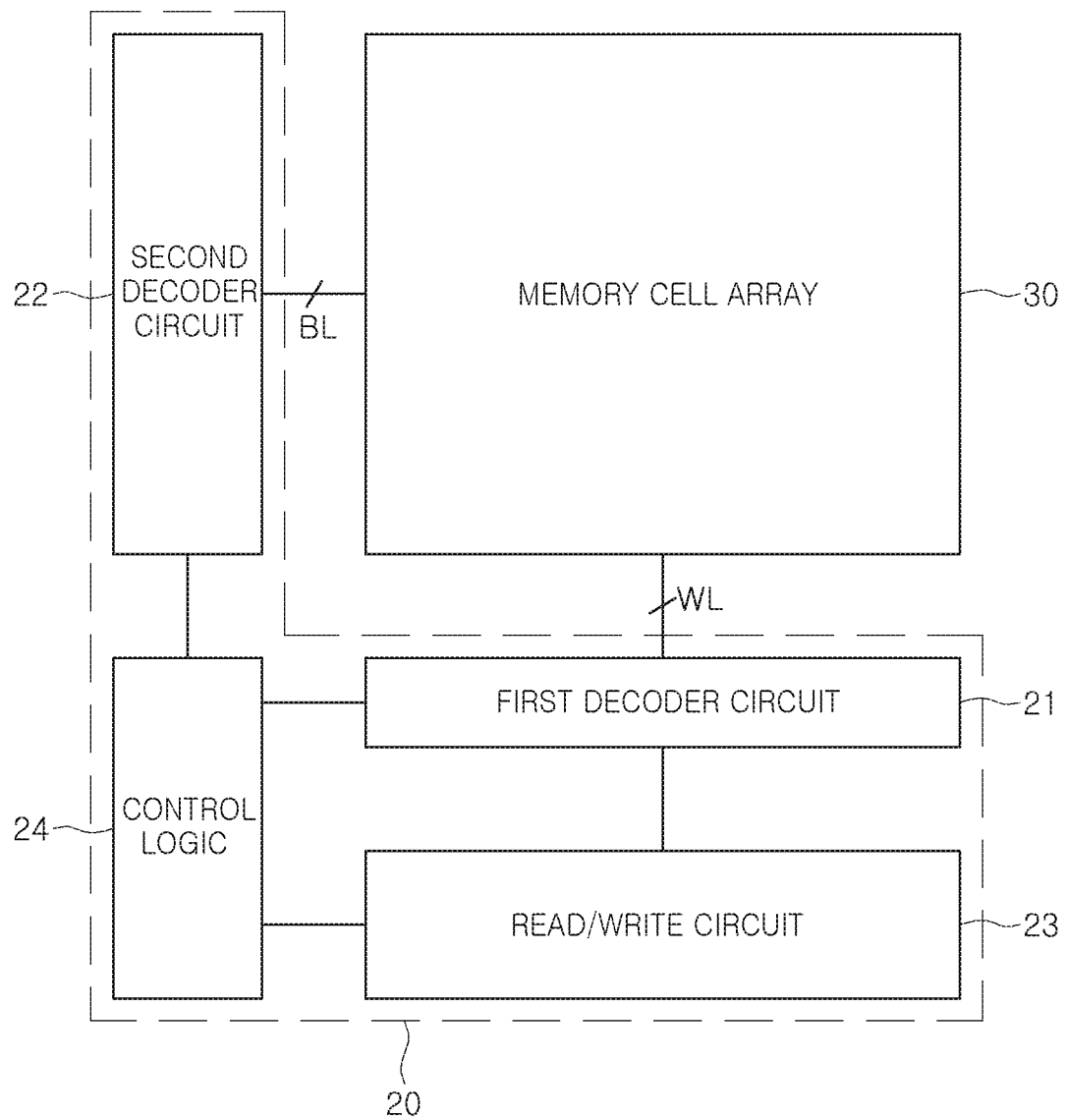
FIG. 2 is a functional block diagram of a memory device according to an example embodiment.

FIG. 2 is a functional block diagram of a memory device 10 according to an embodiment, which may be an example of the memory device 1. The memory device 10 may include a memory controller 20 and a memory cell array 30. The memory controller 20 may include first and second decoder circuits 21 and 22, a read/write circuit 23, and control logic 24. The memory cell array 30 may include a plurality of memory cells. The first decoder circuit 21 may be connected to a plurality of memory cells through word lines WL, and the second decoder circuit 22 may be connected to a plurality of memory cells through bit lines BL. The operation of the first decoder circuit 21, the second decoder circuit 22, and the read/write circuit 23 may be controlled by the control logic 24. In an example embodiment, the read/write circuit 23 may include a program circuit writing data to at least one selected memory cell specified by the first decoder circuit 21 and the second decoder circuit 22, and a readout circuit reading data from the selected memory cell.

The plurality of memory cells included in the memory cell array 30 may have different levels of resistance. When the read/write circuit 23 programs the data in the data of the selected memory cell, the memory device 10 may supply a programming current to the selected memory cell. When the programming current flows through the selected memory cell, the lower the resistance of the selected memory cell, the poorer the programming operation may be. Conversely, the higher the resistance of the selected memory cell, the worse the storage endurance may be.

According to an example embodiment, when the read/write circuit 23 programs data to data of a selected memory cell, the memory device 10 may determine a programming current according to the resistance of the selected memory cell. Since the memory device 10 may supply different programming currents according to the resistance of the selected memory cell, the memory device 10 may compensate for a change in program characteristics according to the resistance of the selected memory cell.

Figure 3A:
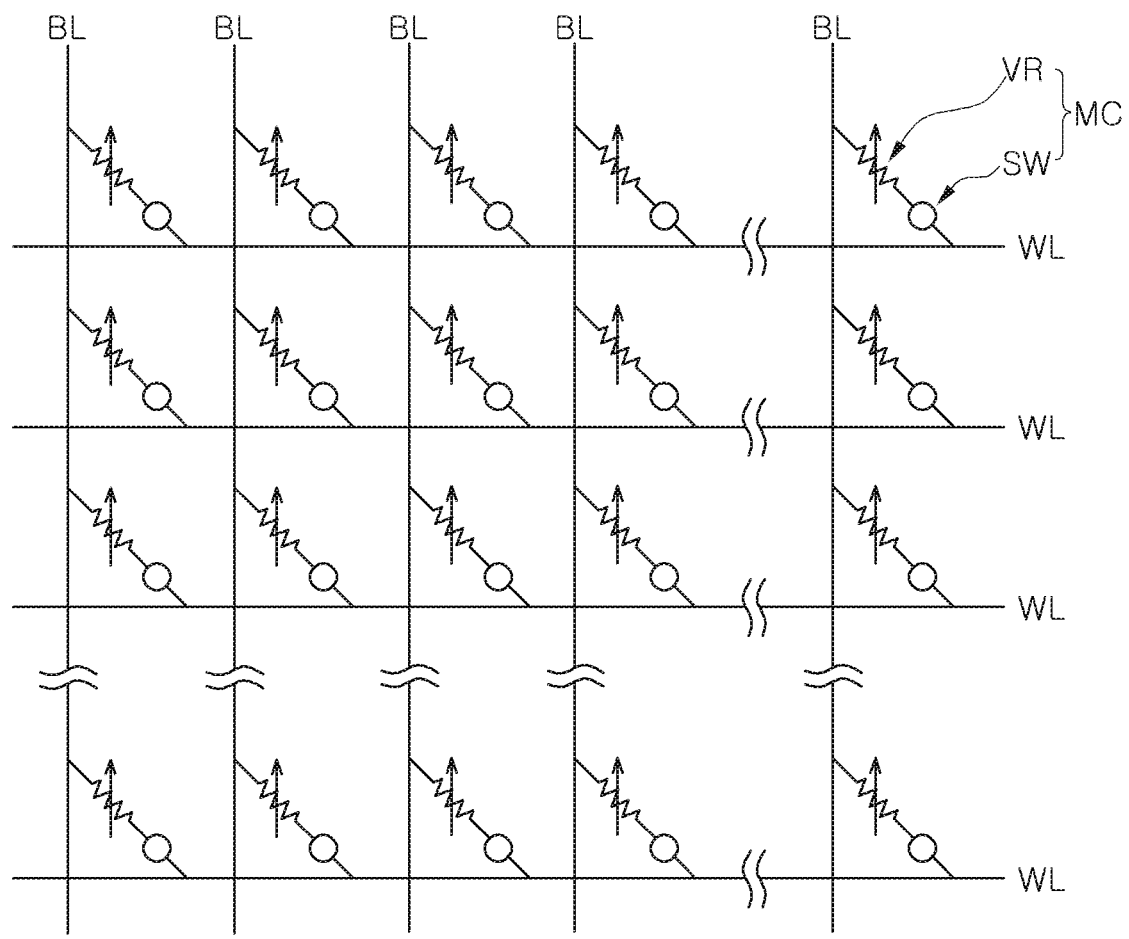
FIGS. 3A and 3B are schematic/layout views illustrating a memory cell array according to respective example embodiments.
Figure 3B:
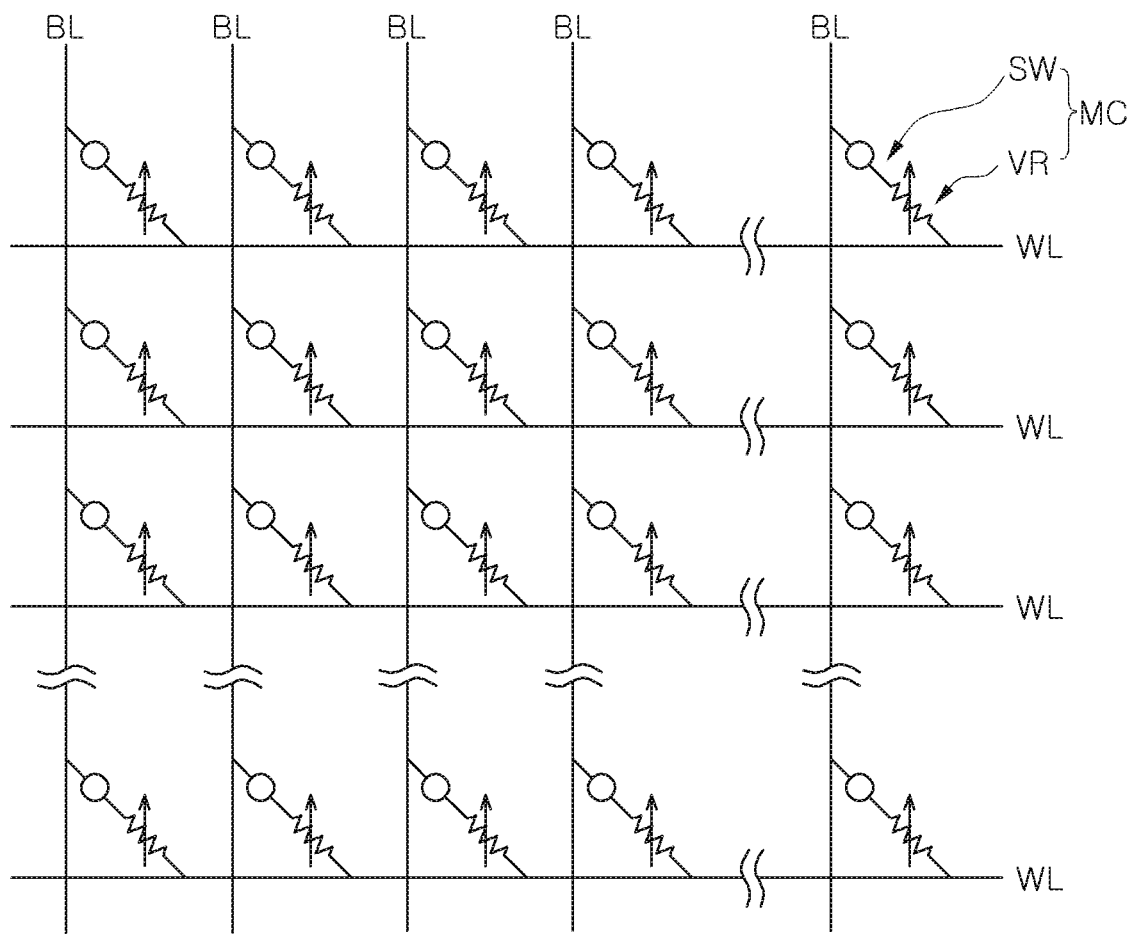

FIGS. 3A and 3B are schematic/layout views of a memory cell array according to respective example embodiments. Referring to FIGS. 2 and 3A, a memory cell array 30A according to an example embodiment may include a plurality of memory cells MC. The plurality of memory cells MC may be provided at a location at which the bit line BL and the word line WL intersect each other. For example, each of the plurality of memory cells MC may be connected to one bit line BL and one word line WL.

As an example, each of the plurality of memory cells MC may include a switching device SW and an information storage device VR. In an example embodiment, the switching device SW may include at least one of a PN junction diode, a Schottky diode, and an ovonic threshold switch (OTS). In addition, in an example embodiment, the information storage device VR may be formed of a phase change material including a chalcogenide material and a superlattice. For example, the information storage device VR may include a phase change material in which phase transition between an amorphous phase and a crystalline phase may be performed according to a heating time and temperature. The information storage device VR and the switching device SW may be connected to each other in series.

The memory controller 20 may record or erase data by phase shifting a phase change material of the information storage device VR included in each of the plurality of memory cells MC to an amorphous phase or a crystalline phase through the bit line BL and the word line WL. In an example embodiment, the memory controller 20 may increase resistance of the information storage device VR by phase shifting the phase change material of the information storage device VR included in the memory cell MC to an amorphous phase. Conversely, the memory controller 20 may reduce resistance of the information storage device VR by phase shifting the phase change material of the information storage device VR included in the memory cell MC to a crystalline phase. The relationship between a resistance value of the information storage device VR and whether data is recorded may be variously defined according to example embodiments. The memory controller 20 may execute a reading operation of reading data from the plurality of memory cells MC by comparing a reading voltage detected by the plurality of memory cells MC with a predetermined reference voltage.

Referring to FIG. 3A, in each of the plurality of memory cells MC, one end of the information storage device VR may be connected to a bit line and one end of the switching device SW may be connected to a word line. In this case, each of the plurality of memory cells MC illustrated in FIG. 3A may have a first orientation.

FIG. 3B will be described based on the differences in comparison with FIG. 3A. Referring to FIG. 3B, one end of the information storage device VR may be connected to a word line and one end of the switching device SW may be connected to a bit line, in each of the plurality of memory cells MC. In this case, each of the plurality of memory cells MC illustrated in FIG. 3B may have a second orientation.

The memory cell array 30 according to the example embodiment illustrated in FIG. 2 may include a plurality of memory cells formed on different layers. For example, the memory cell array 30 may include a first layer and a second layer stacked on each other, and the memory cells included in the first layer have a first orientation, and the memory cells included in the second layer may have a second orientation. However, according to other example embodiments, the orientation of memory cells included in the respective first and second layers may be variously modified.

Figure 4A:
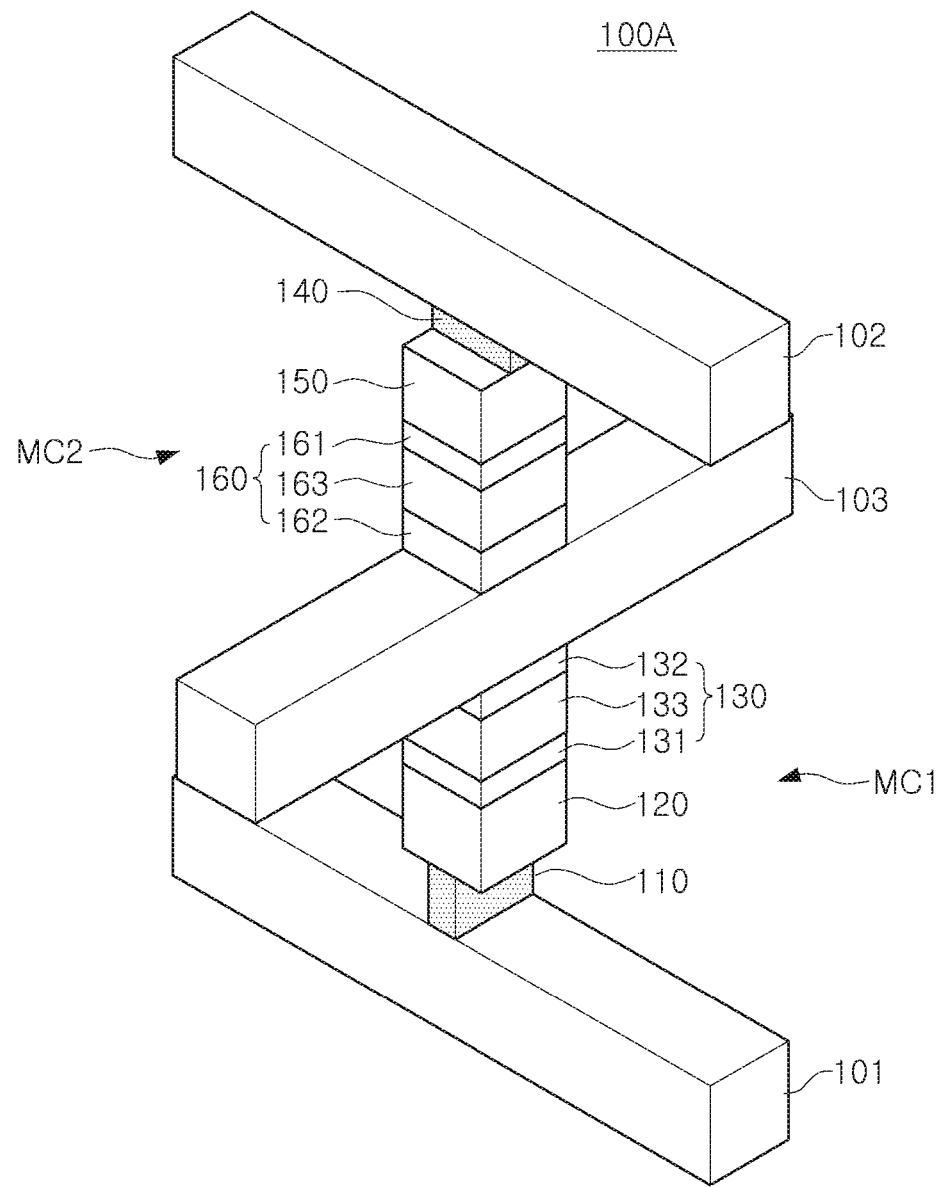
FIGS. 4A and 4B are perspective views illustrating respective example structures of a memory cell included in a memory device according to respective example embodiments.
Figure 4B:
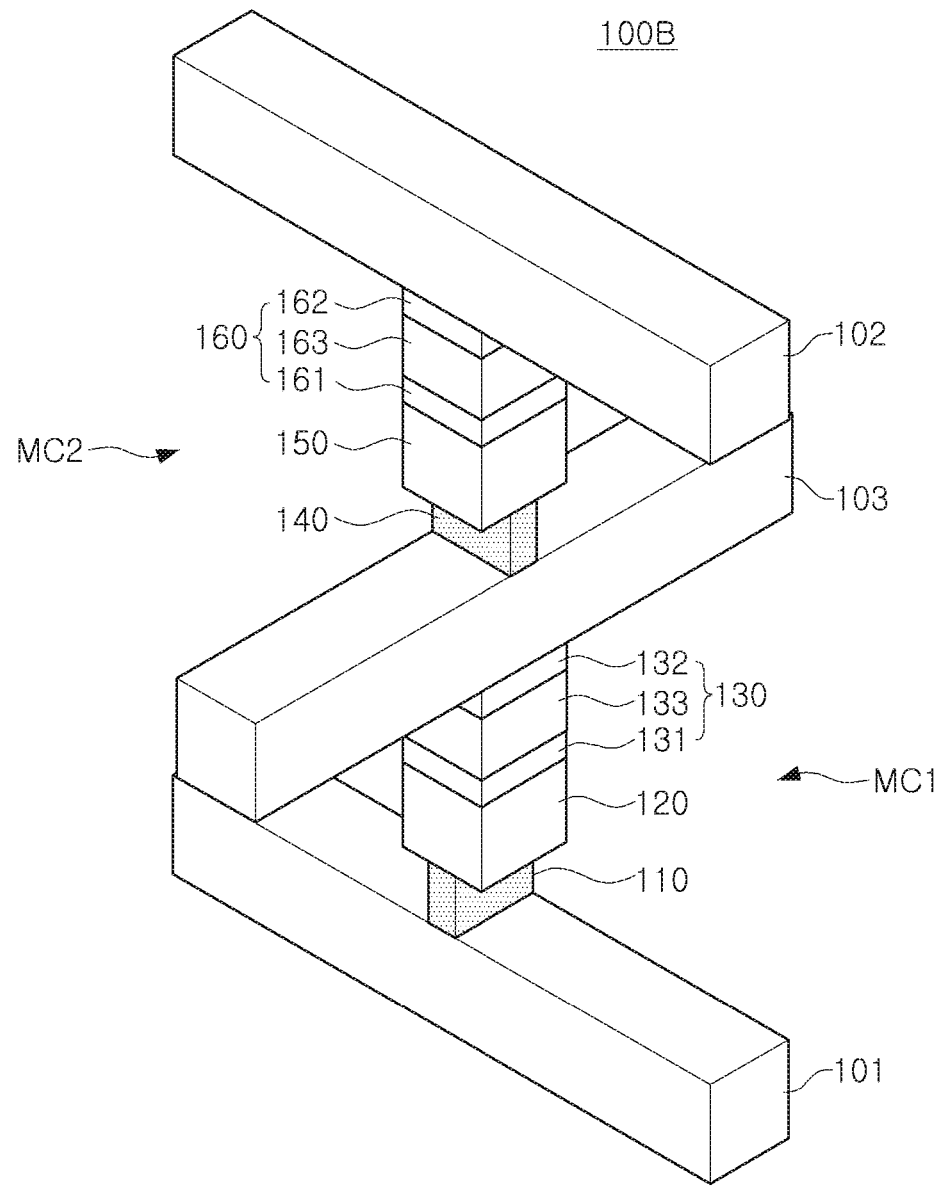

FIGS. 4A and 4B are perspective views illustrating structures of memory cells included in memory devices according to respective example embodiments.

Referring to FIG. 4A, a memory device 100A according to an example embodiment may include a first memory cell MC1 and a second memory cell MC2 provided between a pair of conductive lines 101 and 102. The first memory cell MC1 and the second memory cell MC2 may operate as independent memory cells, respectively. As an example, when a first conductive line 101 and a second conductive line 102 are word lines, a third conductive line 103 between the first and second memory cells MC1 and MC2 may be a bit line. When the first conductive line 101 and the second conductive line 102 are bit lines, the third conductive line 103 may be a word line. Hereinafter, for convenience of description, examples will be described in which the first conductive line 101 and the second conductive line 102 are the first word line and the second word line, respectively.

The first memory cell MC1 may include a first heating electrode 110, a first information storage device 120 and a first switching device 130. The first switching device 130 may include a first switch electrode 131, a second switch electrode 132, and a first selection layer 133 disposed therebetween. In an example embodiment, the first selection layer 133 may include an Ovonic Threshold Switch (OTS) material. When a voltage higher than a threshold voltage is applied between the first switch electrode 131 and the second switch electrode 132, current may flow through the first selection layer 133.

The first information storage device 120 may include a phase change material, and for example, may include a chalcogenide material. As an example, the first information storage device 120 may include Ge—Sb—Te (GST), and a crystallization temperature, a melting point, and a phase change rate according to crystallization energy of the first information storage device 120 may be determined according to the type and chemical composition ratio of elements included in the first information storage device 120.

The second memory cell MC2 may have a structure that is the same or similar to that of the first memory cell MC1. Referring to FIG. 4A, the second memory cell MC2 may include a second heating electrode 140, a second information storage device 150, a second switching device 160, and the like. The structure and the characteristics of each of the second heating electrode 140, the second information storage device 150, and the second switching device 160 may be the same or similar to those of the first heating electrode 110, the first information storage device 120, and the first switching device 130. Hereinafter, a method of writing and erasing data will be described with reference to the first memory cell MC1 as an example.

When a voltage is supplied through the first word line 101 and the bit line 103, Joule heat according to the voltage may be generated at an interface between the first heating electrode 110 and the first information storage device 120. A phase change material constituting the first information storage device 120 may be changed from an amorphous phase to a crystalline phase or from a crystalline phase to an amorphous phase, by the Joule heat. The first information storage device 120 may have a high resistance in the amorphous phase and may have a low resistance in the crystalline phase. In an example embodiment, data '0' or '1' may be defined according to a resistance value of the first information storage device 120.

To write data to the first memory cell MC1, a programming voltage may be supplied through the first word line 101 and the bit line 103. The programming voltage is higher than a threshold voltage of an ovonic threshold switch material included in the first switching device 130, and thus, a current may flow through the first switching device 130. The phase change material included in the first information storage device 120 may change from an amorphous phase to a crystalline phase by the programming voltage, and thus, data may be recorded in the first memory area. In an example embodiment, when the phase change material included in the first information storage device 120 has a crystalline phase, the state of the first memory cell MC1 may be defined as a set state.

On the other hand, to erase data written to the first memory cell MC1, the phase change material included in the first information storage device 120 may be returned from the crystalline phase to the amorphous phase. For example, a predetermined erasing voltage may be supplied through the first word line 101 and the bit line 103. Due to the erasing voltage, the phase change material included in the first information storage device 120 may change from the crystalline phase to the amorphous phase. When the phase change material included in the first information storage device 120 has an amorphous phase, the state of the first memory cell MC1 may be defined as a reset state. For example, a maximum value of the erasing voltage may be greater than a maximum value of the programming voltage, and a period of time for which the erasing voltage is supplied may be shorter than a period of time for which the programming voltage is supplied.

As described above, according to the state of the phase change material included in the information storage devices 120 and 150, resistance values of the information storage devices 120 and 150 may be changed, and the memory controller may distinguish data '0' and '1' from resistors of the information storage devices 120 and 150. Therefore, as a resistance difference between the information storage devices 120 and 150 that appear according to the state of the phase change material included in the information storage devices 120 and 150 increases, the memory controller may correctly read data stored in the memory cells MC1 and MC2.

FIG. 4B will be described based on the differences in comparison with FIG. 4A. Referring to FIGS. 4A and 4B, when the first conductive line 101 and the second conductive line 102 are a first word line and a second word line, respectively, the first memory cell MC1 and the second memory cell MC2 may have different orientations. For example, referring to FIG. 4A, the first memory cell MC1 and the second memory cell MC2 may respectively have a first orientation. Referring to FIG. 4B, the first memory cell MC1 may have a first orientation, and the second memory cell MC2 may have a second orientation.

Figure 5A:
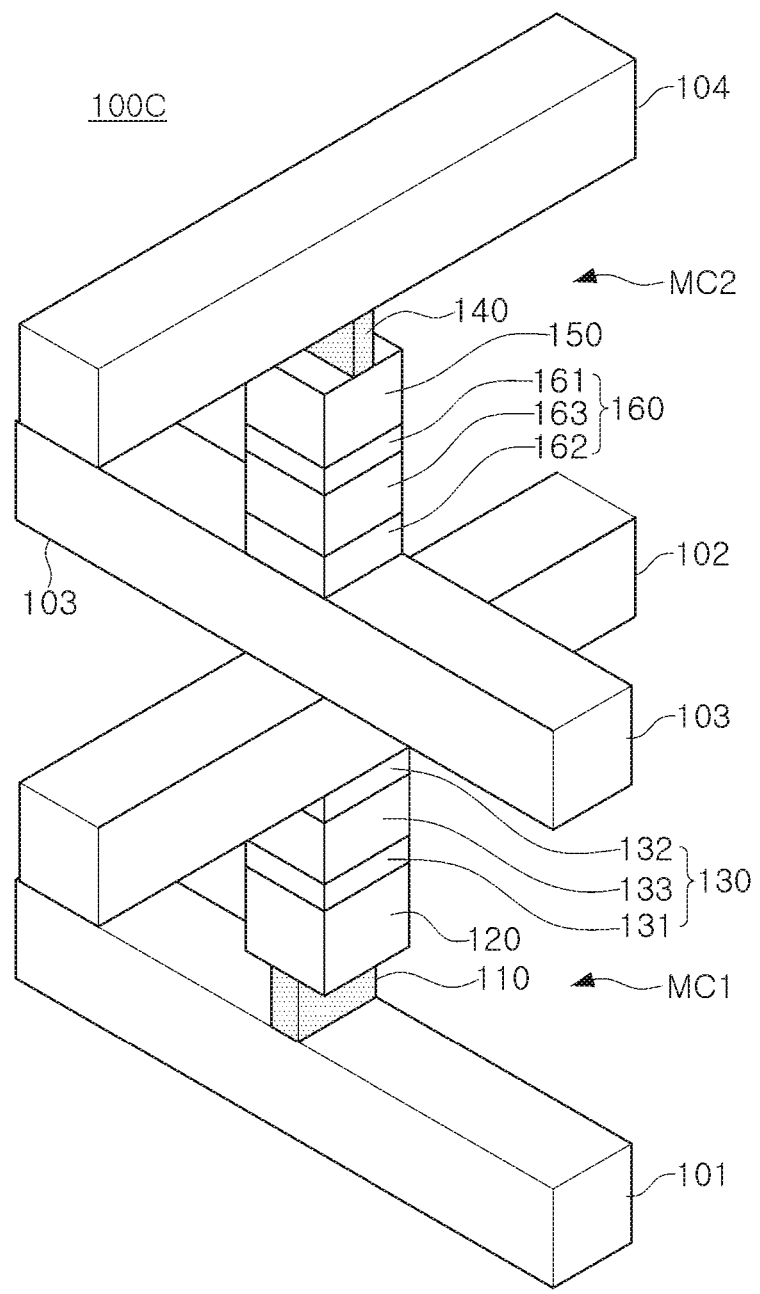
FIGS. 5A and 5B are respective perspective views illustrating respective structures of a memory cell included in a memory device according to respective example embodiments.
Figure 5B:
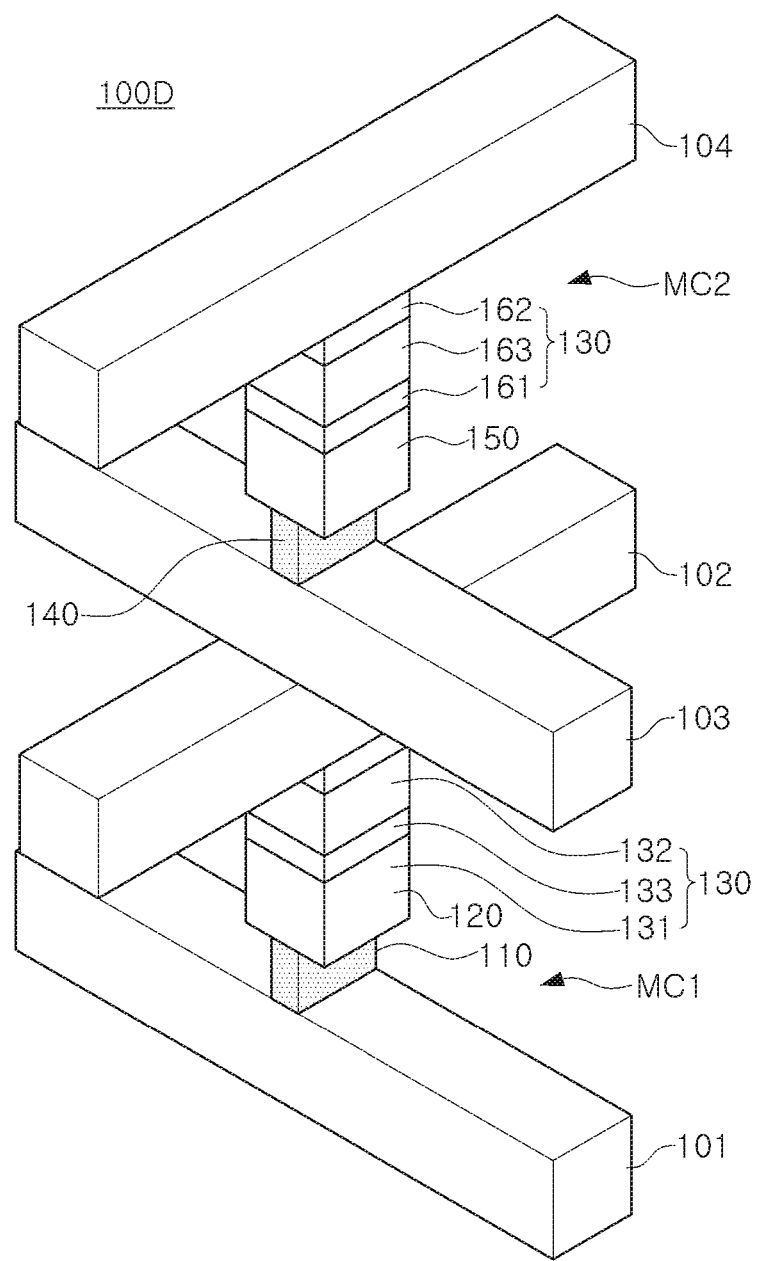

FIGS. 5A and 5B are schematic views illustrating a structure of a memory cell included in a memory device according to an example embodiment.

Structures and features of first and second memory cells MC1 and MC2 illustrated in FIGS. 5A and 5B may be similar to those of the first and second memory cells MC1 and MC2 of FIGS. 4A and 4B. On the other hand, in FIGS. 5A and 5B, the first memory cell MC1 connected to a first word line formed on a first layer and the second memory cell MC2 connected to a second word line formed on a second layer may not share a bit line.

Referring to FIG. 5A, the first memory cell MC1 may be provided at a point at which a first word line 101 formed on the first layer and a first bit line 102 formed on the first layer intersect each other. The second memory cell MC2 may be provided at a point at which a second word line 103 formed on the second layer and a second bit line 104 formed on the second layer intersect each other. The first memory cell MC1 may have a first orientation, and the second memory cell MC2 may have a second orientation.

FIG. 5B will be described based on differences in comparison with FIG. 5A. Referring to FIG. 5B, the first memory cell MC1 and the second memory cell MC2 may respectively have a first orientation.

Figure 6:
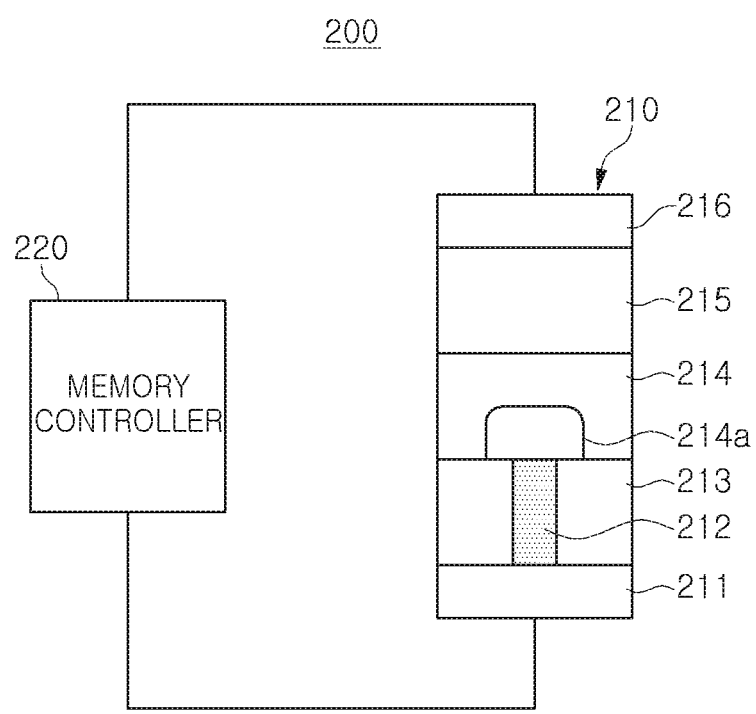
FIG. 6 is a view illustrating an operation of a memory device according to an example embodiment.

FIG. 6 is a diagram illustrating an operation of a memory device, 200, according to an example embodiment. The memory device 200 may operate by power supplied by a memory controller 220 to a memory cell 210. The memory cell 210 may include a lower electrode 211, a heating electrode 212, an information storage device 214, a switching device 215 and an upper electrode 216. The lower electrode 211 and the upper electrode 216 may receive a voltage output by the memory controller 220 through a word line or a bit line. An insulating layer 213 may be provided around the heating electrode 212, and a phase change may occur in a partial region 214a of the information storage device 214 adjacent to the heating electrode 212, by power supplied by the memory controller 220.

In an embodiment, in a programming operation for writing data to the memory cell 210, a predetermined bias voltage may be input to each of the lower electrode 211 and the upper electrode 216. Since the bias voltage is higher than the threshold voltage of the ovonic threshold switch material included in the switching device 215, the memory cell 210 may be turned on. Thereafter, the programming current may be supplied to the memory cell 210. The phase change material included in the information storage device 214 may change from an amorphous phase to a crystalline phase by the programming current. Therefore, data may be recorded in the memory area.

Figure 7:
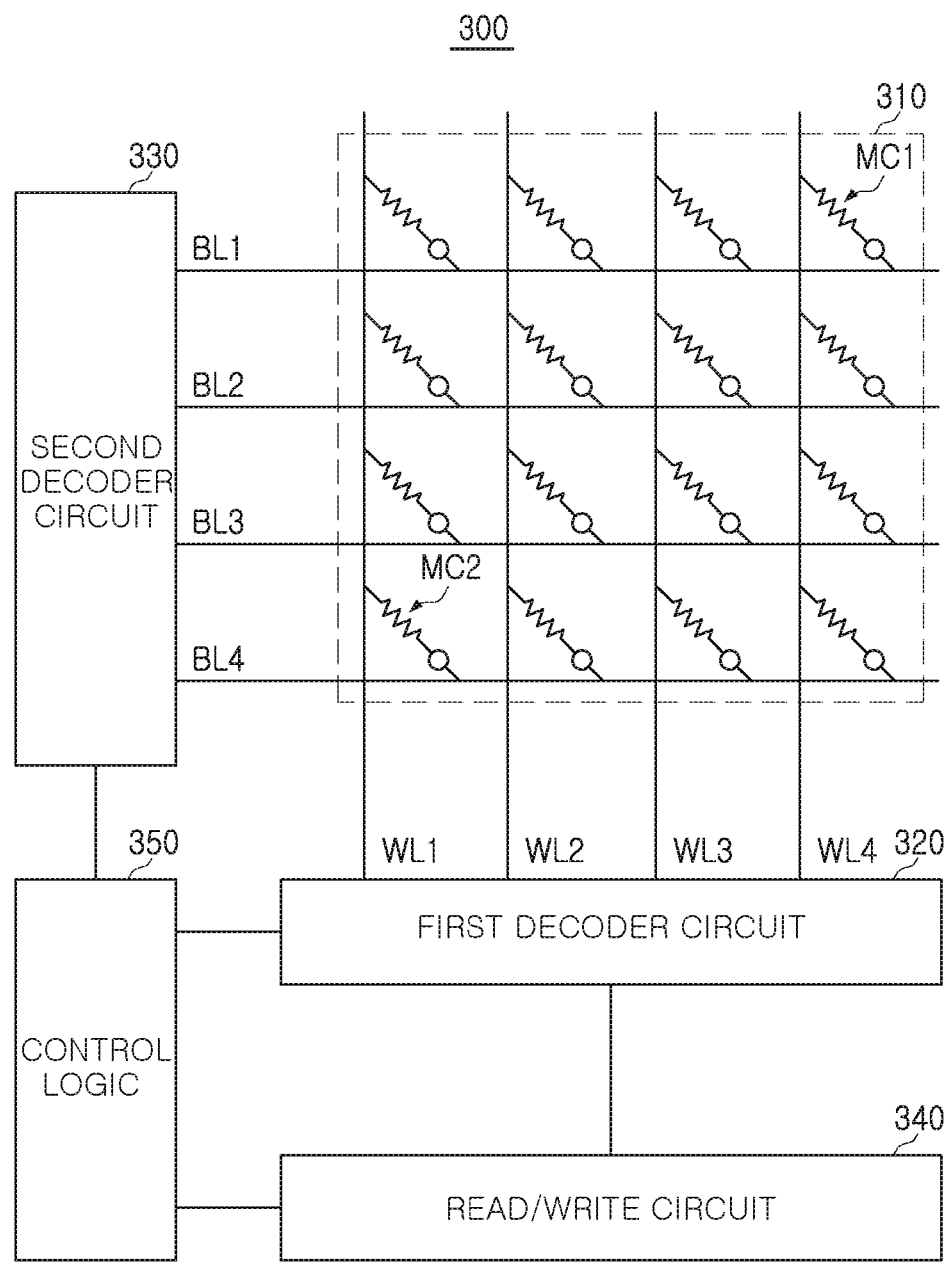
FIG. 7 is a diagram illustrating a programming operation of a memory device according to an example embodiment.

FIG. 7 is a diagram provided to explain a programming operation of a memory device, 300, according to an example embodiment. As shown in FIG. 7, the memory device 300 may include a memory cell array 310, a first decoder circuit 320, a second decoder circuit 330, a read/write circuit 340, and a control logic 350. The memory cell array 310 may include first to fourth bit lines BL1 to BL4, first to fourth word lines WL1 to WL4, and a plurality of memory cells MC. The plurality of memory cells MC may be provided at locations at which the first to fourth bit lines BL1 to BL4 and the first to fourth word lines WL1 to WL4 intersect each other.

The plurality of memory cells MC included in the memory cell array 310 may have different current paths. In this regard, "current path" may refer to the distance between the decoder circuits 320 and 330 from the memory cell. Memory cells with long current paths may have relatively higher path resistances than memory cells with short current paths. Conversely, a memory cell having a short current path may have a relatively small path resistance compared to a memory cell having a long current path. The path resistance may include a bit line resistor, a word line resistor, a switch resistor, and the like.

The memory cell array 310 may include a first memory cell MC1 and a second memory cell MC2. The first memory cell MC1 may be a memory cell furthest from the first decoder circuit 320 and the second decoder circuit 330. The second memory cell MC2 may be a memory cell closest to the first decoder circuit 320 and the second decoder circuit 330. The first memory cell MC1 furthest from the first decoder circuit 320 and the second decoder circuit 330 has the largest path resistance, and the second memory cell MC2 is closest to the first decoder circuit 320 and the second decoder circuit 330 and has the smallest path resistance.

In addition, the plurality of memory cells included in the memory cell array 310 may have different levels of resistance regardless of the current path. For example, the resistance of the memory cells may be classified into low resistance, intermediate resistance, and high resistance within a range of 3.1 KΩ to 8.3 KΩ.

Meanwhile, in the programming operation, the first decoder circuit 320 and the second decoder circuit 330 may select a memory cell to be programmed from among memory cells. The memory cell to be programmed by the memory device 300 may be referred to as a selected memory cell. Each of the word line and the bit line connected to the selected memory cell may be referred to as a selected word line and a selected bit line.

When a read/write circuit 340 programs the selected memory cell, a current source connected to the selected word line may supply a programming current to the selected memory cell. The programming current may flow from the selection bit line to the selected word line through the selection memory cell.

In a programming operation, program characteristics may vary according to a current path of a selected memory cell. In addition, even if the current paths are the same, program characteristics may vary according to the resistance of the selected memory cell. For example, the programming operation may not be performed properly or the durability/storage endurance may be degraded according to the current path of the selected memory cell and/or the resistance of the selected memory cell.

In the related art, programming currents having the same magnitude are supplied to memory cells having different program characteristics. According to Equation 1, the joule heat generated in the memory cell when the programming current Ipgm flows in the memory cell may be proportional to the resistance Rdyn of the memory cell.

$$\text{Joule} \propto Ipgm^2 * Rdyn \qquad \text{[Equation 1]}$$

Figure 8A:
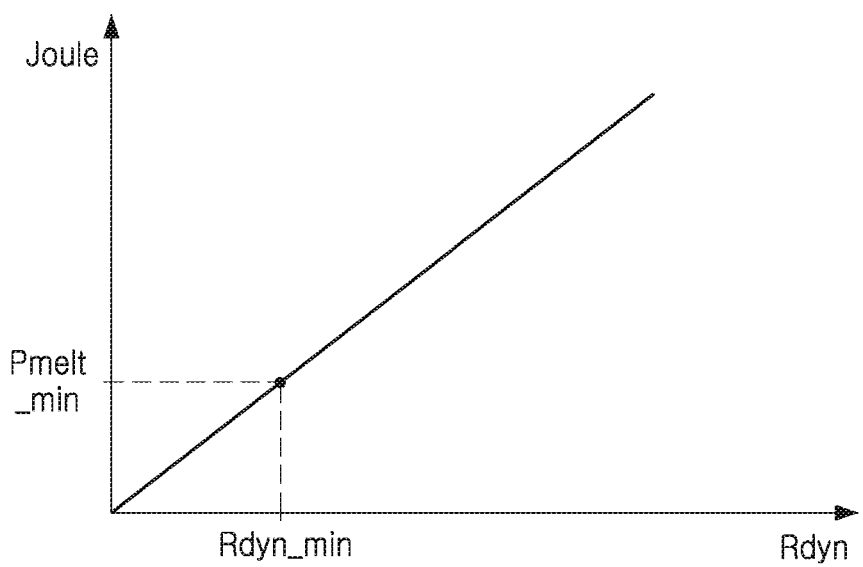
FIG. 8A illustrates Joule heat based on a resistance of a memory cell according to an example embodiment.

FIG. 8A illustrates Joule heat based on a resistance of a memory cell according to an example embodiment. Referring to FIG. 8A, the programming current is determined based on the memory cell having the lowest resistance Rdyn. For example, the minimum programming current may be determined based on the minimum Joule Pmelt_min required for programming the memory cell having the minimum resistance Rdyn_min. Therefore, when a programming current flows in the memory cell, excessive heat may be generated in the memory cell as the resistance Rdyn of the memory cell is higher than the minimum resistance Rdyn_min.

Figure 8B:
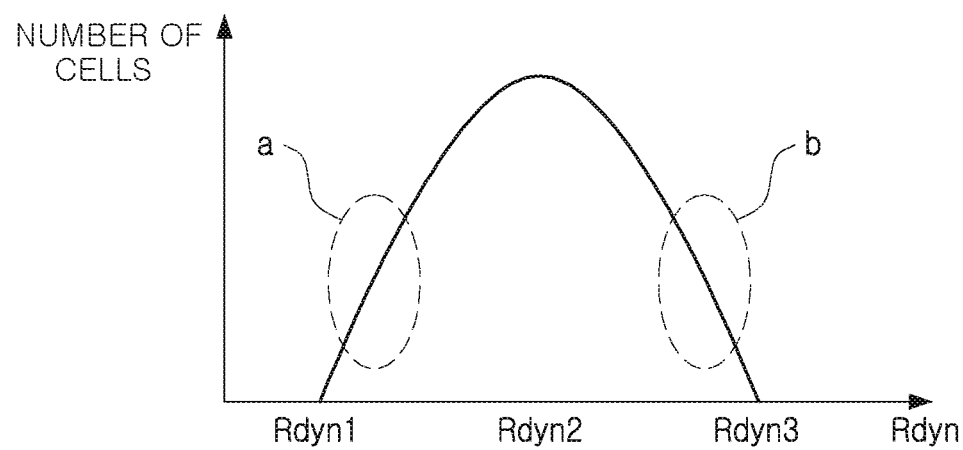
FIG. 8B illustrates the distribution of memory cells according to the resistance of the memory cell according to an example embodiment.

FIG. 8B illustrates the distribution of memory cells according to the resistance of the memory cell according to an example embodiment. As shown in FIG. 8B, the memory cells in region a having a resistance Rdyn1 lower than the intermediate resistance Rdyn2 may not sufficiently generate Joule heat based on the intermediate resistance Rdyn2. Therefore, memory cells in region "a" may not be properly programmed. Conversely, the memory cells in region b having the resistance Rdyn3 higher than the intermediate resistance Rdyn2 may have excessive Joule heat. Therefore, the memory cells in region b may have poor durability or endurance.

Returning to FIG. 7, when the memory device 300 according to an embodiment of the present disclosure programs a selected memory cell of the memory cell array 310, a programming current is determined according to the resistance of the selected memory cell. The determined programming current may be supplied to the selected memory cell. Therefore, the memory device 300 may compensate for the change in the program characteristic according to the resistance of the selected memory cell during the programming operation.

Also, when the memory device 300 determines the programming current, the memory device 300 may consider the current path of the selected memory cell. Therefore, the memory device 300 may compensate for a change in program characteristics according to a current path of the selected memory cell during a programming operation.

Figure 9:
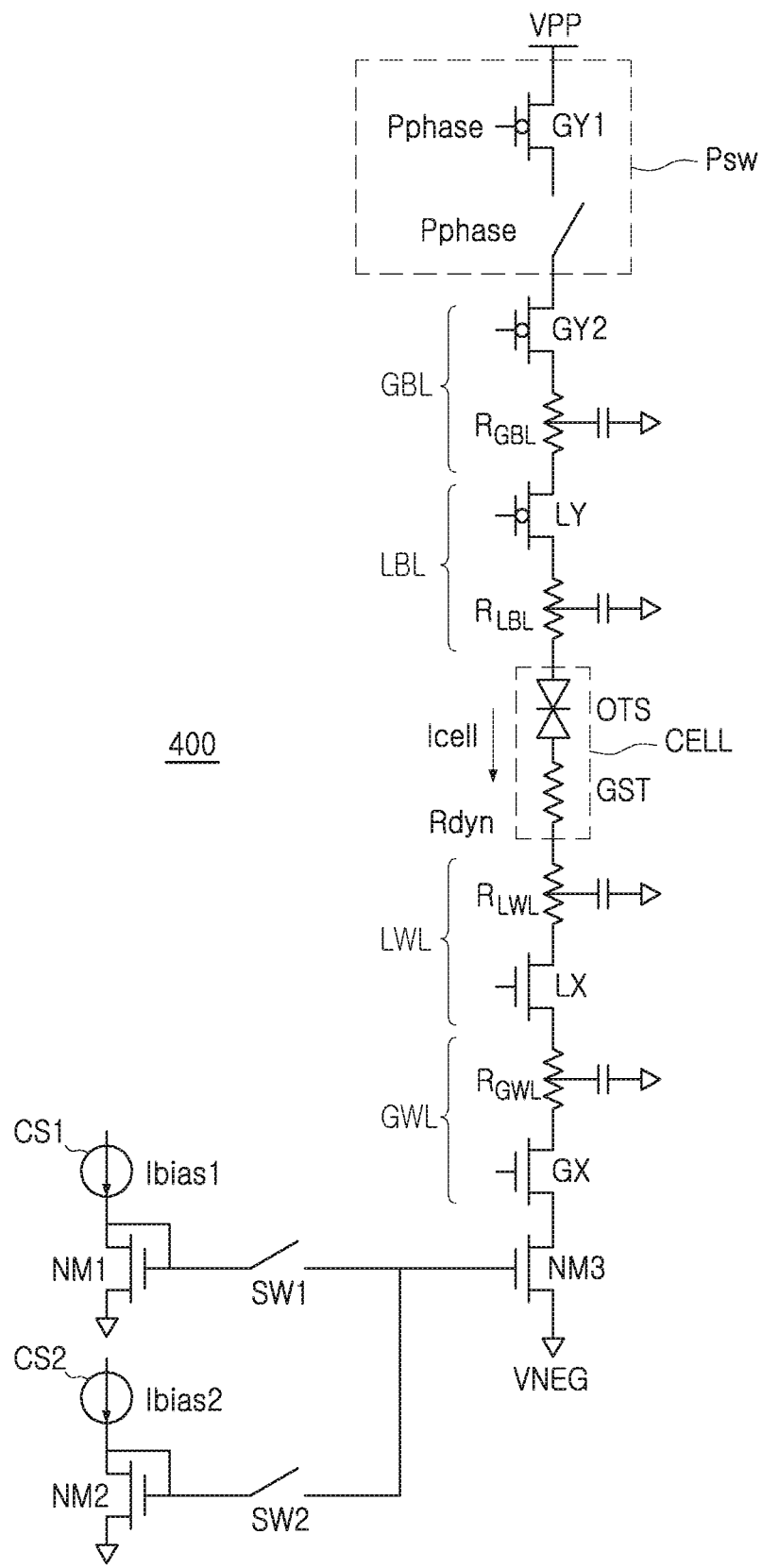
FIG. 9 is a circuit diagram of a memory device according to an example embodiment.

FIG. 9 is a circuit diagram of a memory device, 400, according to an embodiment of the present inventive concept. The memory device 400 may include a path switch Psw, a global bit line GBL, a local bit line LBL, a global word line GWL, a local word line LWL, a memory cell, and a first cell. The memory device 400 may further include a first current source CS1, a second current source CS2, a diode-connected first NMOS transistor NM1, a diode-connected second NMOS transistor NM2, a third NMOS transistor NM3, a first switch SW1, and a second switch SW2.

The memory cell CELL may be disposed in an area in which the local bit line LBL and the local word line LWL intersect each other. The path switch Psw may selectively form an electrical path for supplying a power supply voltage VPP to the global bit line GBL in response to the selection signal Pphase. To this end, the path switch PSW may include a switching transistor GY1 having a gate that receives the selection signal Pphase. Note that the switch symbol within the path switch PSW adjacent the transistor GY1, as well as other similar switch symbols in subsequent figures with path switches, is included as an indication of the switching state of the corresponding transistor GY1 or the like.

The global bit line GBL may include a global bit line select transistor GY2 and a global bit line resistor RGBL. The global bit line resistor RGBL may represent a parasitic resistor included in the global bit line GBL. The local bit line LBL may include a local bit line select transistor LY and a local bit line resistor RLBL. The local bit line resistor RLBL may represent parasitic resistance included in the local bit line LBL.

The global word line GWL may include a global word line select transistor GX and a global word line resistor RGWL. The global word line resistance RGWL may represent parasitic resistance included in the global word line GWL. The local word line LWL may include a local word line select transistor LX and a local word line resistor RLWL. The local word line resistor RLWL may represent parasitic resistance included in the local word line LWL.

The path resistance included in the current path of the memory cell CELL may be expressed as shown in [Equation 2].

$$R\text{para} = R_{GY\_SW} + R_{GBL} + R_{LY\_SW} + R_{LBL} + R_{LWL} + R_{LX\_SW} + R_{GWL} + R_{GX\_SW} \quad \text{[Equation 2]}$$

In this case, Rpara represents a path resistance, $R_{GY\_SW}$ represents a switch resistance of the global bit line select transistor GY2, $R_{LY\_SW}$ represents a switch resistance of the local bit line select transistor LY, and $R_{LX\_SW}$ represents a switch resistance of a local word line select transistor LX, and $R_{GX\_SW}$ represents a switch resistance of the global word line select transistor GX.

Figure 10:
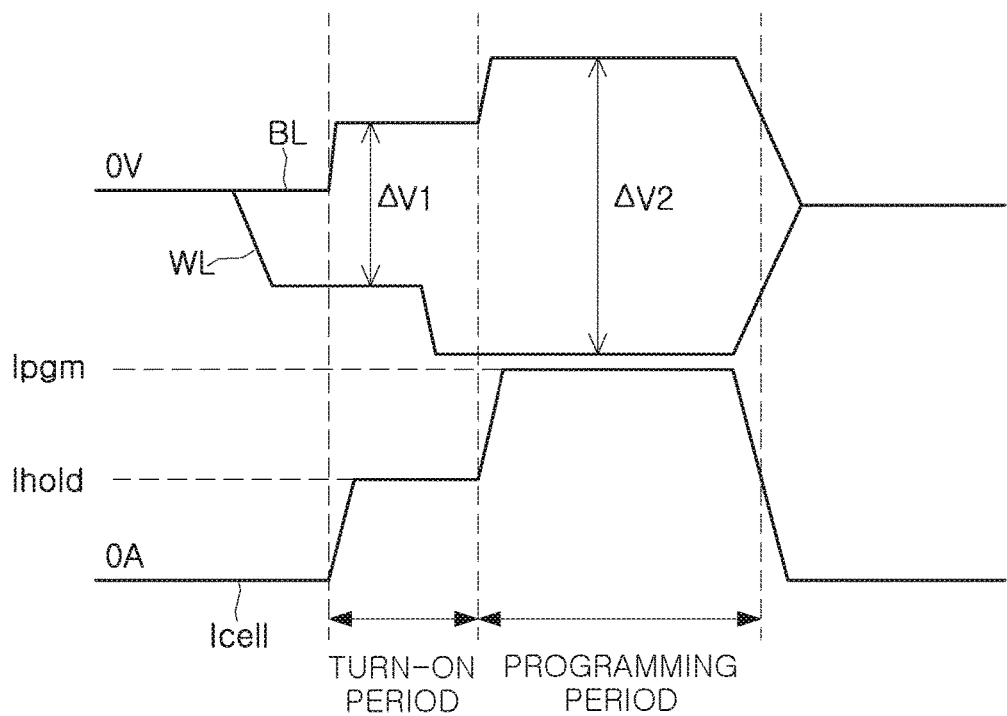
FIG. 10 is a diagram illustrating a programming operation of a memory device according to an example embodiment.

FIG. 10 is a diagram for describing a programming operation of the memory device 400 of FIG. 9 according to an example embodiment. Referring to FIGS. 9 and 10, the selected word line WL may be precharged (prior to the "turn-on period") to a first voltage level (exemplified as lower than 0V), and the selected bit line BL may be precharged to a second voltage level (exemplified as 0V). As a result, a first voltage ΔV1 higher than the threshold voltage may be supplied across opposite ends of the selection memory cell CELL during the turn-on period. When the first voltage ΔV1 higher than the first threshold voltage is supplied across the selection memory cell CELL, the selection memory cell CELL may be turned on. For example, the first threshold voltage may mean a voltage at a time when the selected memory cell CELL is turned on.

When the selected memory cell CELL is turned on, in order to prevent the turned-on selected memory cell CELL from being turned off, the memory device 400 may supply a hold current Ihold to the selected memory cell CELL. The hold current Ihold may refer to a minimum current required for the selected memory cell CELL to avoid being be turned off. To supply the hold current Ihold to the selection memory cell CELL, the memory device 400 may close the first switch SW1 to connect the first current source CS1 to the selected word line WL.

When the first switch SW1 is closed, the diode-connected first NMOS transistor NM1 and the third NMOS transistor NM3 may form a current mirror. By the current mirror, a hold current Ihold corresponding to the first bias current Ibias1 may flow in the selected memory cell CELL (Icell=Ihold).

In the "programming period" after the turn-on period, the memory device 400 may supply the programming current Ipgm to the selected memory cell CELL. The magnitude of the programming current Ipgm may be higher than the magnitude of the hold current Ihold. To supply a programming current Ipgm having a magnitude higher than that of the hold current Ihold, the memory device 400 precharges the selected word line WL to a third voltage level (exemplified as being lower than the second voltage level), and precharges the selection bit line BL, e.g., to a fourth voltage level higher than the previous level. As a result, a second voltage ΔV2 higher than the first voltage ΔV1 may be supplied across opposite ends of the selection memory cell CELL during the programming period. The memory device 400 may connect the second current source CS2 to the selected word line WL by opening the first switch SW1 and closing the second switch SW2.

When the second switch SW2 is closed, the diode-connected second NMOS transistor NM2 and the third NMOS transistor NM3 may form a current mirror. By the current mirror, a programming current Ipgm corresponding to the second bias current Ibias2 may flow in the memory cell CELL (Icell=Ipgm).

Figure 11:
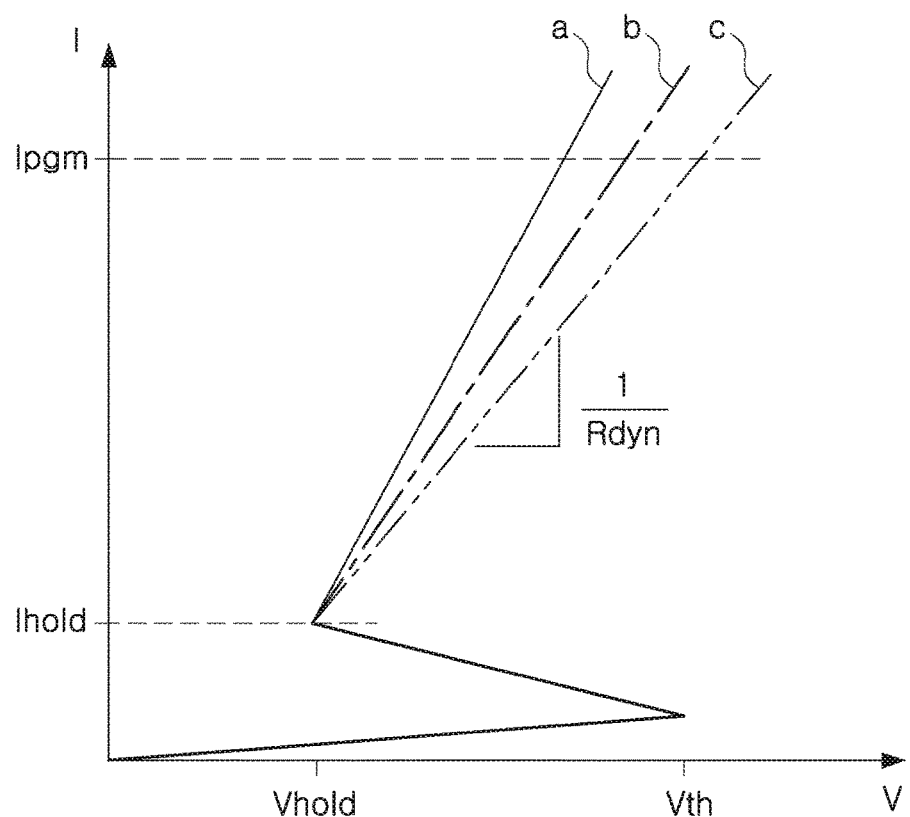
FIG. 11 is a graph illustrating a voltage-current graph of a memory cell in a programming operation of a memory device according to an example embodiment.

FIG. 11 is a graph illustrating a voltage-current graph of a memory cell in a programming operation of a memory device according to an example embodiment.

Referring to FIGS. 10 and 11, as the first voltage ΔV1 is supplied to the selected word line WL and the selection bit line BL during the turn-on period, the voltages across the selection memory cell may increase to a threshold voltage Vth. Thus, the selected memory cell may be turned on.

A hold current Ihold may be supplied to the selection memory cell to prevent the selection memory cell from turning off after the selection memory cell is turned on. Accordingly, the voltage across the selected memory cell may be a hold voltage Vhold.

Meanwhile, the voltage-current graph of the memory cell may vary according to whether the resistance of the selected memory cell is a low resistance (a), an intermediate resistance (b), or a high resistance (c). The slope in the voltage-current graph of the memory cell may correspond to the inverse of the resistance Rdyn of the memory cell.

When a programming current Ipgm is supplied to the selection memory cell during the programming period after the turn-on period, the voltage across the selection memory cell may vary according to the resistance of the selection memory cell. For example, when the resistance of the selected memory cell is a low resistance (a), the voltage across the selected memory cell may be a first voltage. When the resistance of the selected memory cell is an intermediate resistance (b), the voltage across the selected memory cell may be a second voltage. When the resistance of the selected memory cell is high resistance C, the voltage across the selected memory cell may be a third voltage. The second voltage may be higher than the first voltage and lower than the third voltage.

For example, when a programming current Ipgm is supplied to the selected memory cell, the voltage across the selected memory cell may increase as the resistance of the selected memory cell increases. Therefore, when the programming current Ipgm is supplied to the selection memory cell, excessive heat may occur in the selection memory cell as the resistance of the selection memory cell increases.

According to an embodiment of the present disclosure, when the memory device programs the selected memory cell, the programming current may be differently determined according to the resistance of the selected memory cell. For example, the lower the resistance of the selected memory cell may increase the magnitude of the programming current, and the higher the resistance of the selected memory cell may reduce the magnitude of the programming current. Therefore, the memory device may compensate for a change in program characteristics according to the resistance of the selected memory cell during a programming operation.

Figure 12:
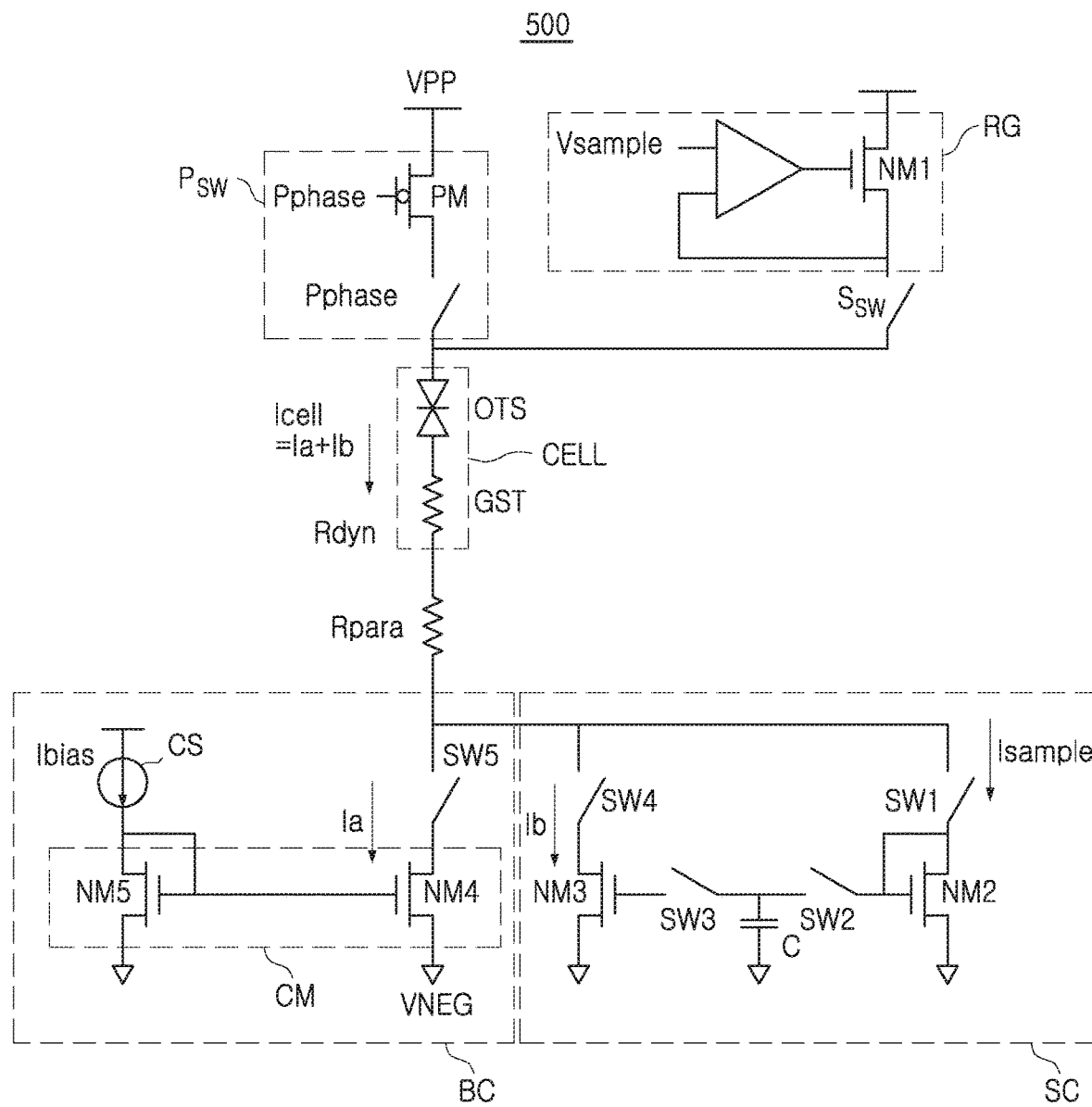
FIG. 12 is a circuit diagram of a memory device according to an example embodiment.

FIG. 12 is a circuit diagram of a memory device, 500, according to an embodiment of the present inventive concept. The memory device 500 may include a path switch Psw, a voltage regulator RG, a select switch Ssw, a memory cell CELL, a path resistor Rpara, a sampling circuit SC, and a bias current circuit (BC). The voltage regulator RG, the sampling circuit SC, and the bias current circuit BC may be included in a program circuit.

The path switch Psw may selectively form an electrical path for supplying a power supply voltage VPP to the global bit line based on the selection signal Pphase.

The voltage regulator RG may receive a sampling voltage Vsample. The voltage regulator RG may stably supply the sampling voltage Vsample to the memory cell CELL connected to the voltage regulator RG. The sampling voltage Vsample may be a voltage for compensating the position of the memory cell CELL. Thus, the sampling voltage Vsample may be a voltage determined based on the current path of the memory cell.

For example, a memory cell having a distally located, long current path has a higher path resistance than a memory cell having a proximally located, short current path, and thus a sampling voltage Vsample may be relatively large. Conversely, a memory cell having a proximally located current path has a lower path resistance than a memory cell having a distally located current path, and thus a sampling voltage Vsample may be relatively small.

The voltage regulator RG may include an amplifier and a first NMOS transistor NM1.

The selection switch Ssw may selectively form an electrical path for supplying the sampling voltage Vsample to the memory cell CELL through the voltage regulator RG.

The path resistance Rpara may refer to the path resistance of the memory cell described with reference to [Equation 2].

The sampling circuit SC may include first to fourth switches SW1-SW4, a second NMOS transistor NM2, a third NMOS transistor NM3, and a capacitor C. When the selection switch Ssw is closed, the sampling voltage Vsample may be supplied to the memory cell CELL, and the sampling current Isample may flow through the memory cell CELL. At this time, when the first switch SW1 and the second switch SW2 are closed, the capacitor C may be charged with the sampling current Isample flowing through the memory cell CELL.

The sampling current Isample may be expressed as shown in Equation 3 below.

$$Isample = \frac{Vsample - Vhold}{Rpara + Rdyn} \quad \text{[Equation 3]}$$

In this case, Vsample may be a sampling voltage determined based on the location of the memory cell, Vhold may be a hold voltage across the memory cell, Rpara may be a path resistance, and Rdyn may represent a resistance of the memory cell.

The hold voltage Vhold may have a fixed value according to the characteristics of the memory cell. Meanwhile, although the path resistance Rpara depends on the location of the memory cell, the sampling voltage Vsample is a voltage determined based on the location of the memory cell, so the sampling current Isample may have a value at which the location of the memory cell is compensated. Therefore, the sampling current Isample may be a value that varies according to the resistance Rdyn of the memory cell.

For example, as the resistance Rdyn of the memory cell is higher, the sampling current Isample may be relatively reduced. As the resistance Rdyn of the memory cell is lower, the sampling current Isample may increase relatively. For example, the resistance Rdyn of the memory cell may be sampled by detecting the sampling current Isample.

When the selection switch Ssw is opened and the path switch Psw is closed, the power supply voltage VPP may be supplied to the memory cell CELL. At this time, when the first switch SW1 and the second switch SW2 are opened and the third switch SW3 and the fourth switch SW4 are closed, the charge stored in the capacitor C may be discharged. Therefore, an additional programming current Ib corresponding to the sampling current Isample may be generated. Thus, the additional programming current Ib may be a current whose size is adjusted according to the resistance Rdyn of the memory cell.

The bias current circuit BC may include a fifth switch SW5, a current mirror CM, and a current source CS. The current mirror CM may include a fourth NMOS transistor NM4 and a fifth NMOS transistor NM5. When the fifth switch SW5 is closed when the power supply voltage VPP is supplied to the memory cell CELL, the current source CS may be connected to the selected word line. The initial programming current Ia corresponding to the bias current Ibias may be generated by the current mirror CM.

Therefore, when the power supply voltage VPP is supplied to the memory cell, the final programming current Icell flowing in the memory cell may correspond to the sum of the initial programming current Ia and the additional programming current Ib (Icell=Ia+Ib). By adding the additional programming current Ib, which is scaled according to the memory cell resistance Rdyn, to the initial programming current Ia, the memory device changes the program characteristics according to the resistance Rdyn of the memory cell during a programming operation to compensate for the position of the memory cell.

In addition, since the sampling current Isample has a value at which the position of the memory cell is compensated, the memory device may compensate for a change in program characteristics according to a current path of the memory cell CELL during a programming operation.

Hereinafter, an operation of the memory device according to an embodiment of the present inventive concept will be described in more detail with reference to FIGS. 13 to 15.

Figure 13:
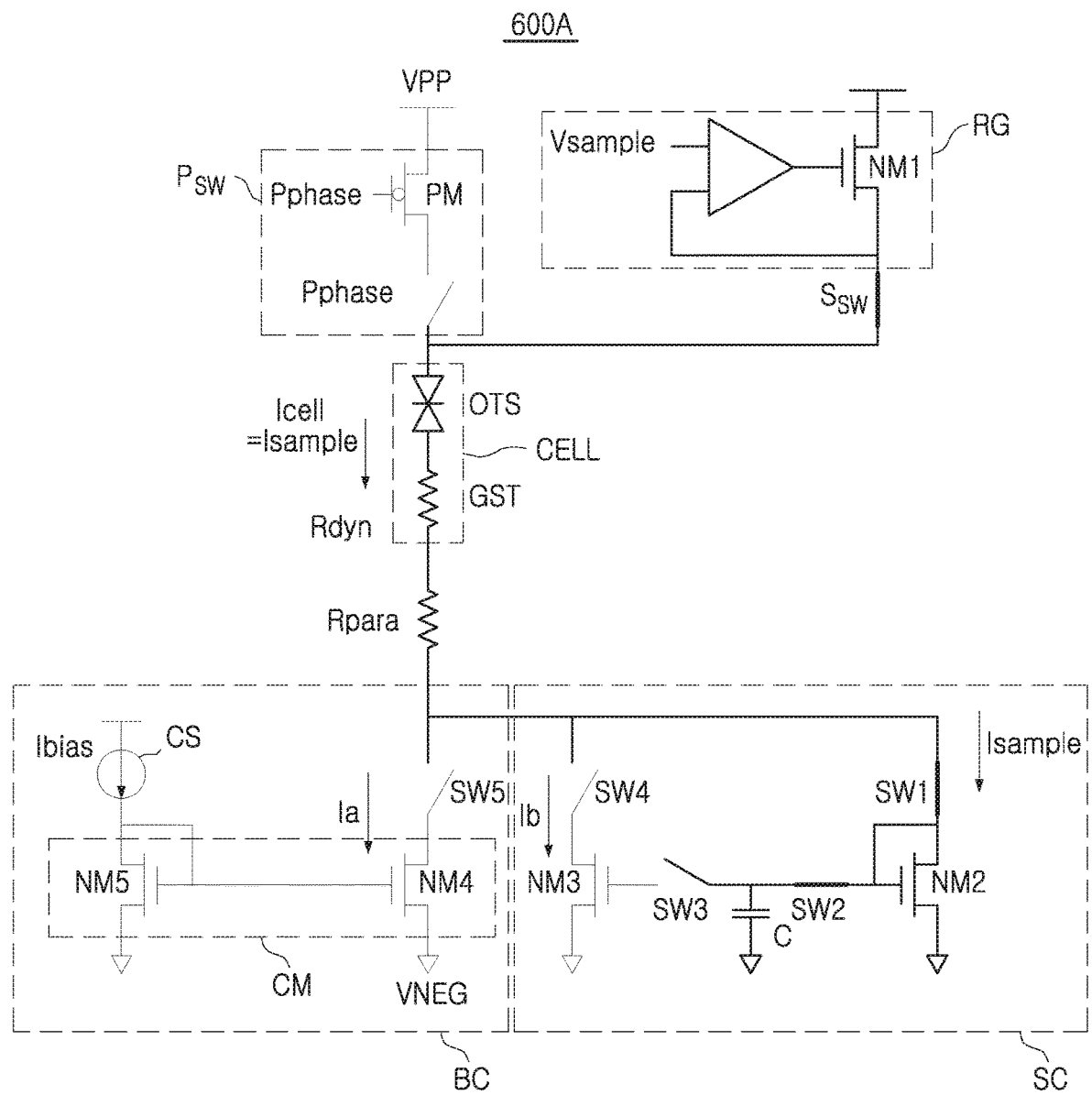
FIGS. 13, 14 and 15 are diagrams illustrating a programming operation of a memory device according to an example embodiment.
Figure 14:
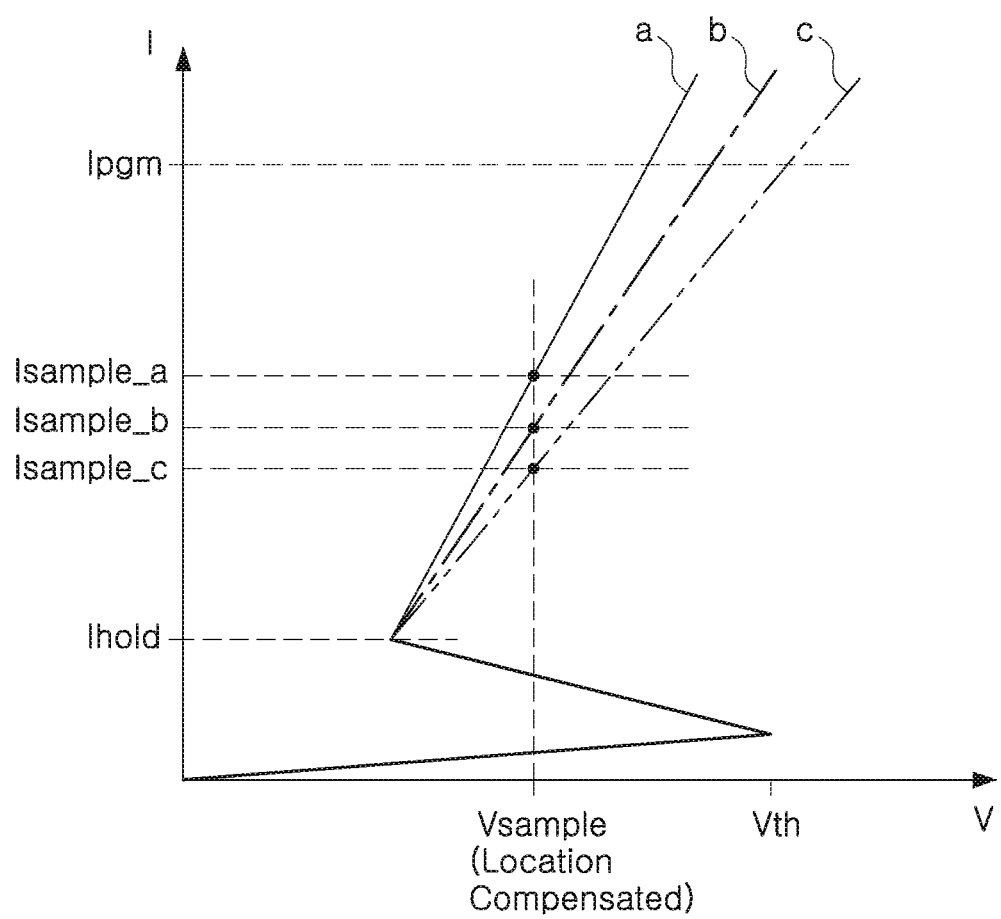
Figure 15:
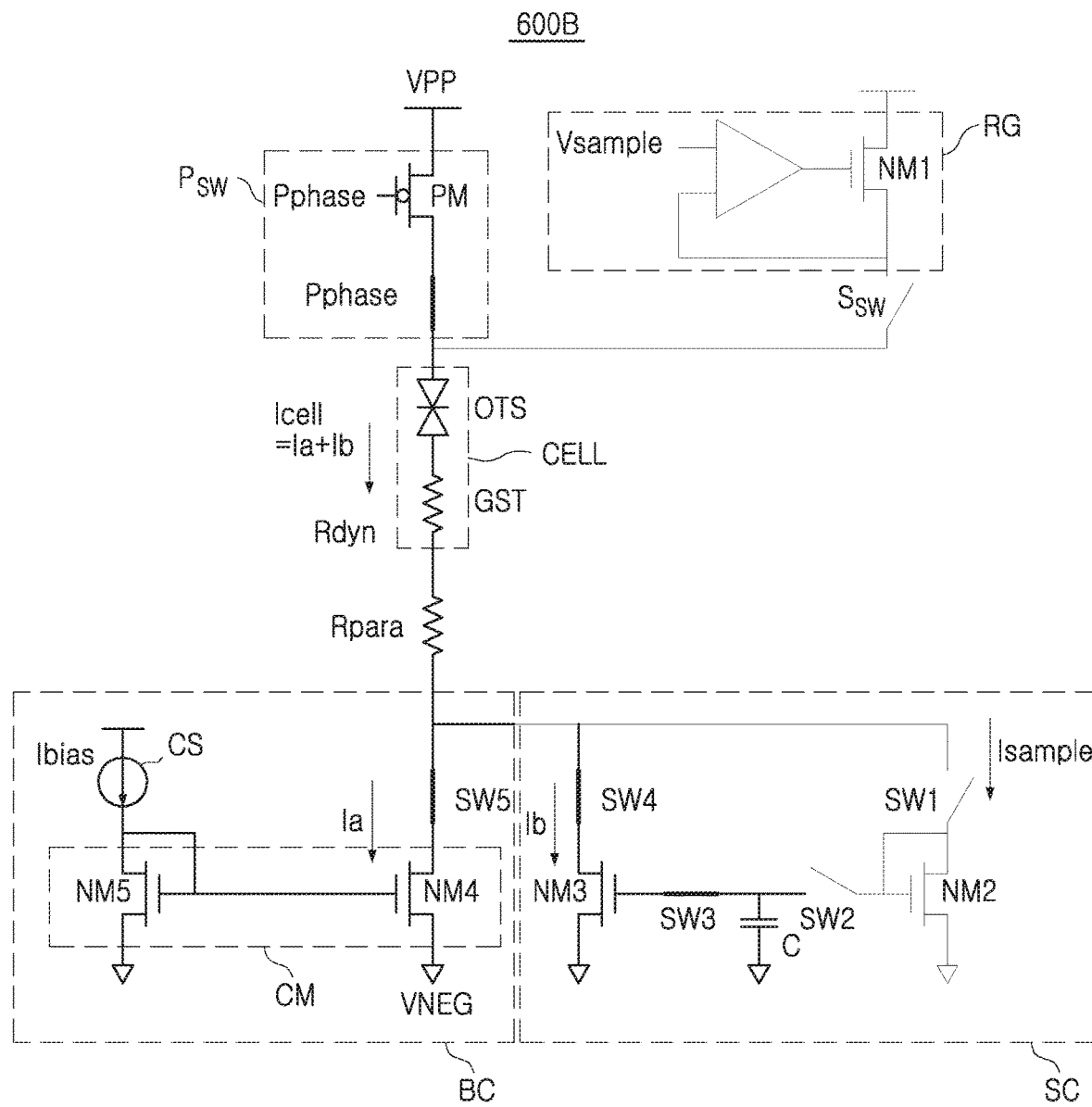

FIGS. 13 to 15 are diagrams for describing a programming operation of a memory device according to an example embodiment. The memory device according to an embodiment of the present disclosure may operate by dividing into a sampling section and a program section. FIGS. 13 and 14 are diagrams for describing an operation of a memory device in a sampling section, and FIG. 15 is a diagram for describing an operation of a memory device in a program section.

Referring to FIGS. 13 and 14, when the memory device 600A operates in the sampling period, the selection switch Ssw, the first switch SW1, and the second switch SW2 may be closed. In this case, the sampling voltage Vsample determined based on the location of the memory cell CELL may be supplied to the memory cell CELL. When the sampling voltage Vsample is supplied to the memory cell CELL, a sampling current Isample whose size is adjusted according to the resistance Rdyn of the memory cell may flow in the memory cell CELL (Icell=Isample).

For example, when the resistance of the memory cell is a low resistance a, the first sampling current Isample_a may flow in the memory cell CELL. When the resistance of the memory cell is the intermediate resistance b, the second sampling current Isample_b may flow in the memory cell CELL. When the resistance of the memory cell is high resistance c, the third sampling current Isample_c may flow in the memory cell CELL. The magnitude of the second sampling current Isample_b may be lower than the magnitude of the first sampling current Isample_a and higher than the magnitude of the third sampling current Isample_c.

The capacitor C may be charged with the sampling current Isample. The resistance Rdyn of the memory cell may be sampled by detecting the amount of charge of the capacitor C charged by the sampling current Isample.

Referring to FIG. 15, when the memory device 600B operates in the program section after the sampling period, the selection switch Ssw may be opened and the path switch Psw may be closed. In this case, the power supply voltage VPP may be supplied to the memory cell CELL. In addition, the first switch SW1 and the second switch SW2 may be opened, and the third to fifth switches SW3 to SW5 may be closed.

The sampling circuit SC may generate the additional programming current Ib by discharging the charge charged in the capacitor C. The bias current circuit BC may generate an initial programming current Ia corresponding to the bias current Ibias.

Therefore, when the memory device 600B operates in the program section, the final programming current Icell flowing in the memory cell CELL may correspond to the sum of the initial programming current Ia and the additional programming current Ib (Icell=Ia+Ib).

Since the final programming current Icell is a current whose size is adjusted according to the resistance Rdyn of the memory cell, the memory device 600B may compensate for a change in program characteristics according to the resistance Rdyn of the memory cell during a programming operation.

Also, since the final programming current Icell is a current determined in consideration of the current path of the memory cell CELL, the memory device 600B may compensate for a change in program characteristics according to the current path of the memory cell during a programming operation.

Figure 16A:
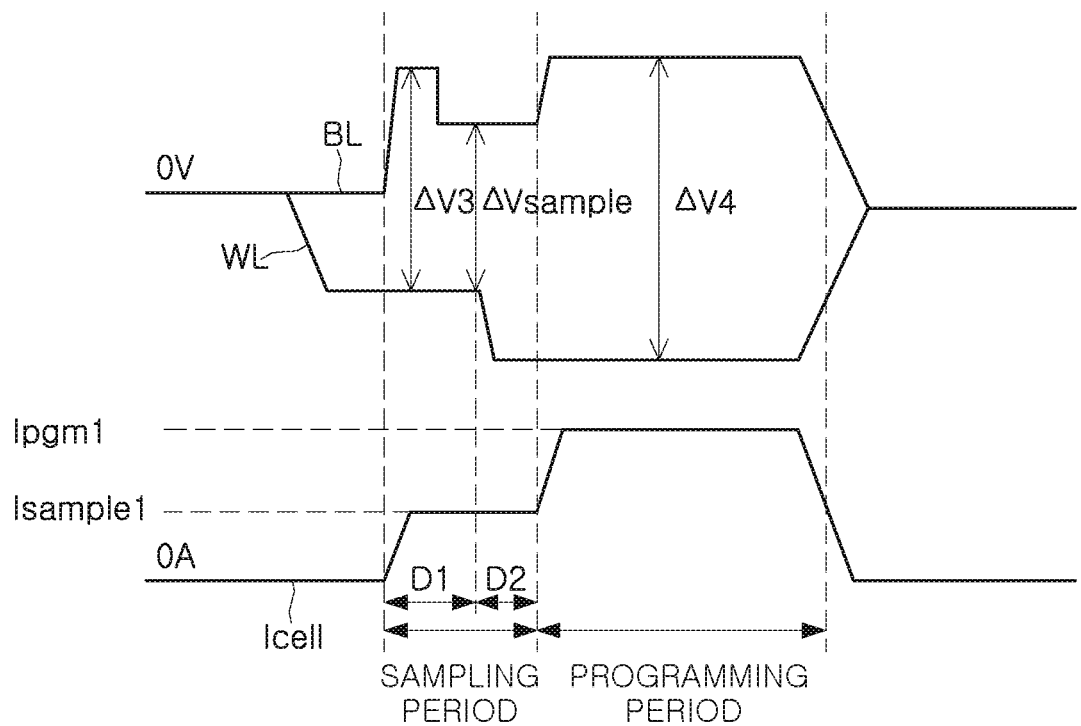
FIGS. 16A, 16B and 16C are diagrams illustrating a programming operation of a memory device according to an example embodiment.
Figure 16B:
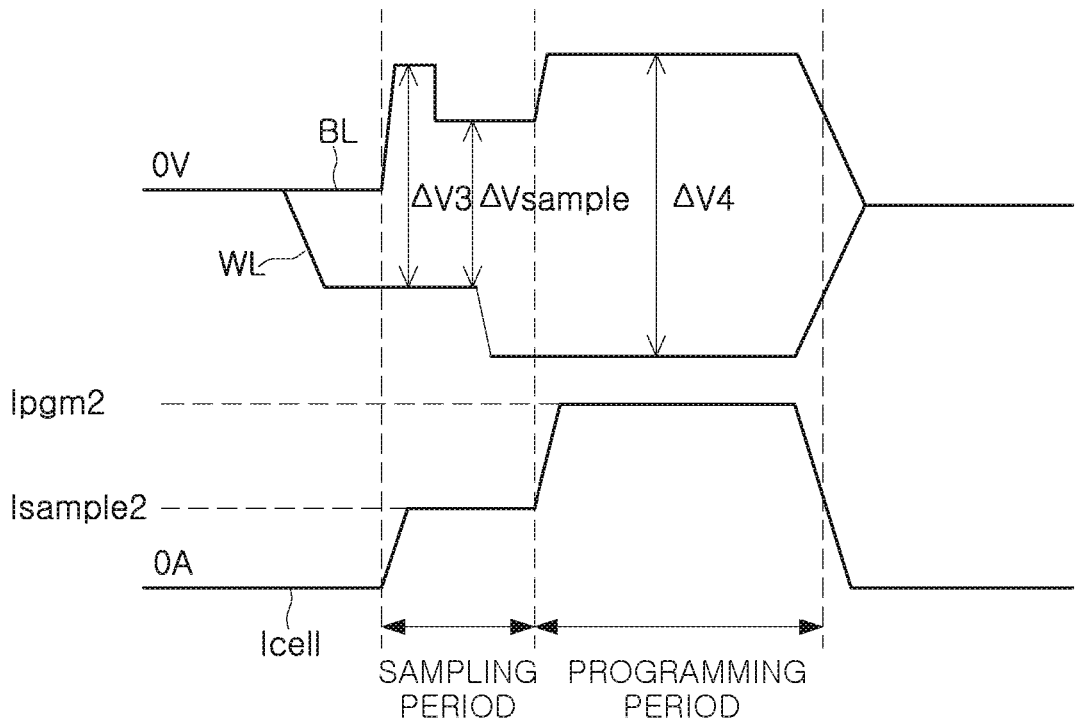
Figure 16C:
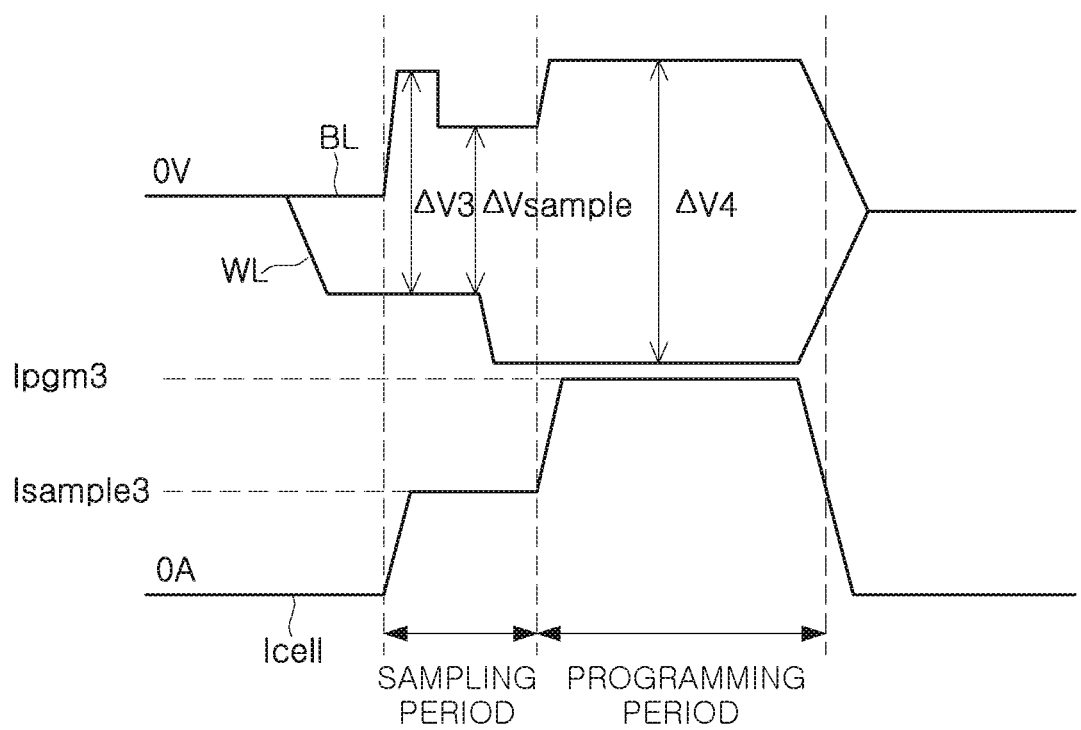

FIGS. 16A to 16C are diagrams for describing a programming operation of a memory device according to an example embodiment.

Referring to FIG. 16A, the selected word line WL may be precharged to the first voltage level, and the selected bit line BL may be precharged to the second voltage level. As a result, a third voltage ΔV3 higher than a threshold voltage may be supplied across opposite ends of the selected memory cell CELL in the first period D1 of the sampling period. When the third voltage ΔV3 higher than the threshold voltage is supplied across the selection memory cell CELL, the selection memory cell CELL may be turned on. For example, the threshold voltage may mean a voltage at a time when the selected memory cell CELL is turned on.

When the selected memory cell CELL is turned on, the sampling voltage Vsample may be supplied to the memory cell CELL in the second period D2 of the sampling period. The sampling voltage Vsample may be lower than the third voltage ΔV3. The first sampling current Isample1 whose size is adjusted according to the resistance Rdyn of the memory cell may flow in the selected memory cell CELL by the sampling voltage Vsample. For example, the first sampling current Isample1 may be a current flowing through the memory cell when the resistance Rdyn of the memory cell is high.

In the programming period after the sampling period, a power supply voltage VPP may be connected to the memory cell. The fourth voltage ΔV4 higher than the third voltage ΔV3 may be supplied across opposite ends of the selected memory cell CELL by the power supply voltage VPP. The sampling voltage Vsample may be lower than the fourth voltage ΔV4.

Meanwhile, the memory device may generate an additional programming current corresponding to the first sampling current Isample1 in the programming period. The additional programming current may be a current whose size is adjusted according to the resistance Rdyn of the memory cell. In addition, the memory device may connect a current source for supplying a bias current to the selected word line during a programming period. An initial programming current corresponding to the bias current may be generated by the current mirror.

In the programming period, the first final programming current Ipgm1 flowing in the memory cell may correspond to the sum of the additional programming current together with the initial programming current.

FIGS. 16B and 16C will be described based on differences in comparison with FIG. 16A. Referring to FIG. 16B, in the sampling period, the second sampling current Isample2 may be a current flowing through the memory cell when the resistance Rdyn of the memory cell is an intermediate resistance. The memory device may generate an additional programming current corresponding to the second sampling current Isample2. The magnitude of the second sampling current Isample2 may be higher than the magnitude of the first sampling current Isample1.

In the programming period after the sampling period, an additional programming current may flow with the initial programming current in the second final programming current Ipgm2 flowing in the memory cell. The magnitude of the second final programming current Ipgm2 may be higher than the magnitude of the first final programming current Ipgm1.

Referring to FIG. 16C, the third sampling current Isample3 may be a current flowing in the memory cell when the resistance dyn of the memory cell is low in the sampling period. The memory device may generate an additional programming current corresponding to the third sampling current Isample3. The magnitude of the third sampling current Isample3 may be higher than that of the first sampling current Isample1 and the second sampling current Isample2.

In the programming period after the sampling period, an additional programming current may flow with the initial programming current in the third final programming current Ipgm3 flowing in the memory cell. The magnitude of the third final programming current Ipgm3 may be higher than the magnitudes of the first final programming current Ipgm1 and the second final programming current Ipgm2.

Figure 17A:
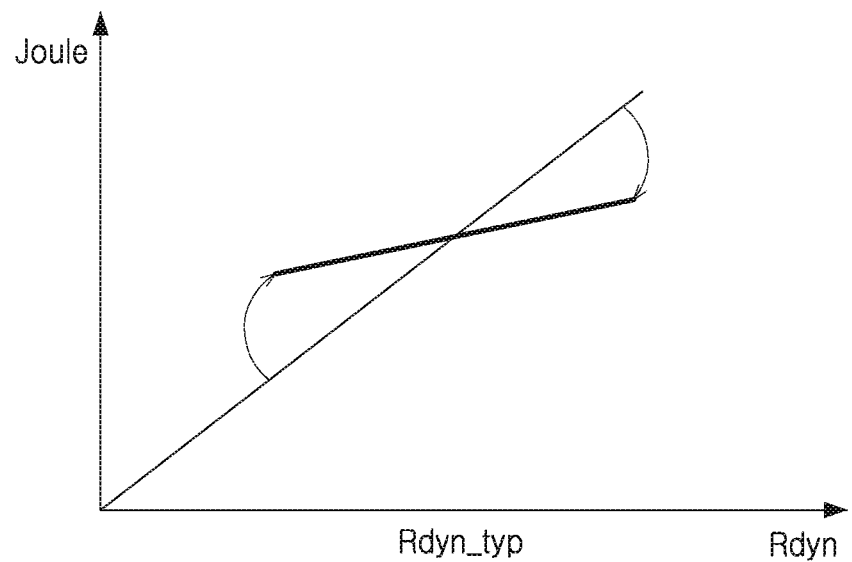
FIG. 17A illustrates Joule heat based on a resistance of a memory cell according to an example embodiment.

FIG. 17A illustrates Joule heat based on a resistance of a memory cell according to an example embodiment. The memory device of example embodiments of the present inventive concept may increase the programming current as the resistance Rdyn of the memory cell is lower, and decrease the programming current as the resistance Rdyn of the memory cell is higher.

As shown in FIG. 17A, since the programming current increases as the resistance Rdyn of the memory cell is lower, sufficient Joule heat may occur in the memory cell. Conversely, the higher the resistance Rdyn of the memory cell is, the more the programming current is reduced, thereby preventing excessive Joule heat from occurring in the memory cell.

Figure 17B:
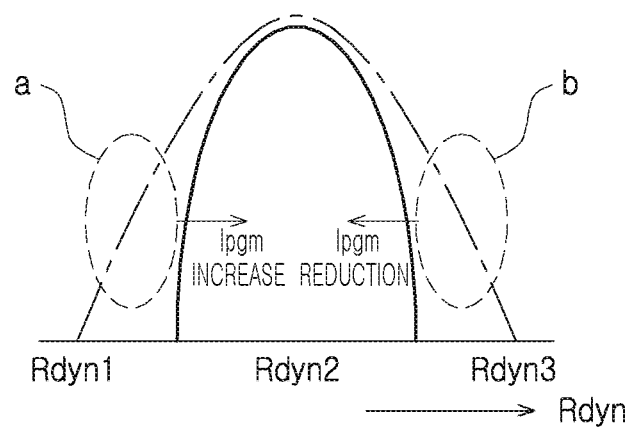
FIG. 17B illustrates a distribution of memory cells according to resistance of the memory cell according to an example embodiment.

FIG. 17B illustrates a distribution according to the resistance of the memory cell according to an example embodiment. Sufficient Joule heating may occur in the memory cells (area "a") having a resistance Rdyn1 lower than the intermediate resistance Rdyn2 based on the intermediate resistance Rdyn2, so that the region "a" of the dispersion may move to the right. Therefore, the programming operation may be normally performed. On the contrary, excessive Joule heat may be prevented from occurring in the memory cells (region b) having the resistance Rdyn3 higher than the intermediate resistance rdyn2, so that the region b of the dispersion may move to the left. Thus, the durability/endurance of the memory cell may be improved. Overall, there is an effect of narrowing the dispersion of memory cells.

Figure 18:
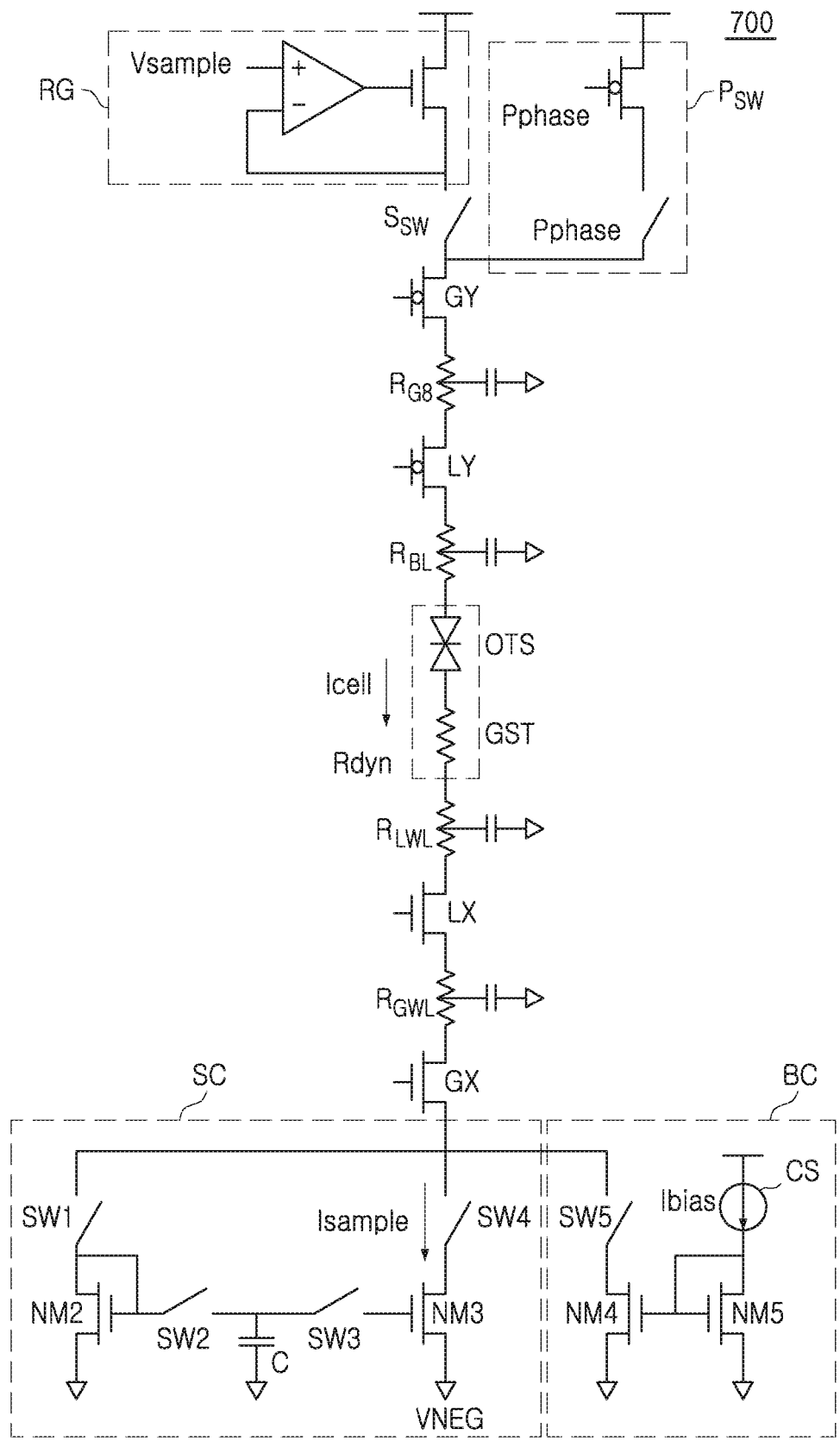
FIG. 18 is a diagram illustrating a memory device according to an example embodiment.
Figure 19:
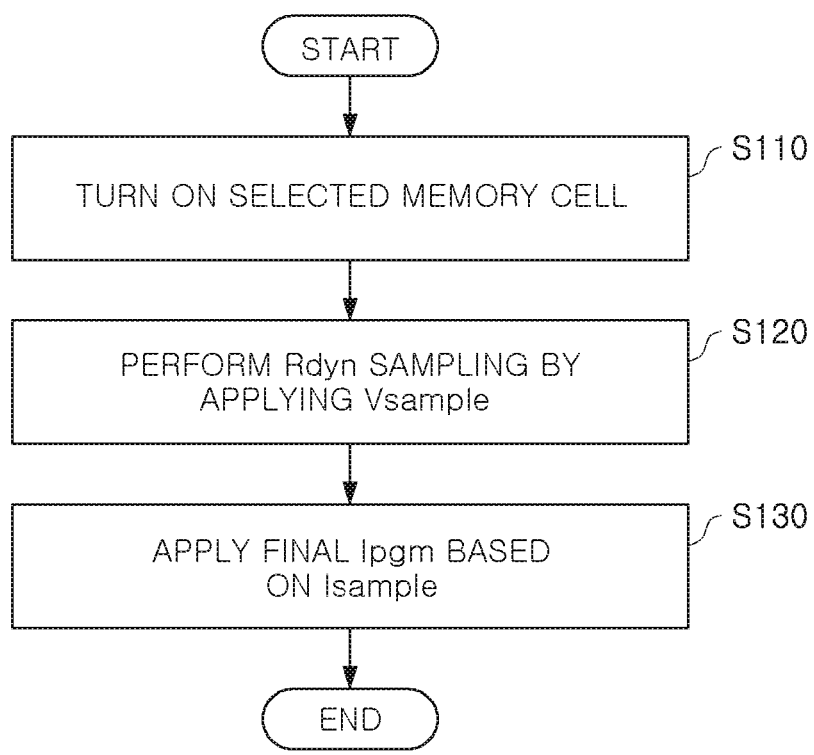
FIG. 19 is a flowchart illustrating an operation of a memory device according to an example embodiment.

FIG. 18 is a flowchart illustrating an example of a memory device, and FIG. 19 is a flowchart illustrating an operation of a memory device, according to an embodiment of the present disclosure.

Referring to FIGS. 18 and 19, as the selected word line and the selection bit line are precharged, a voltage higher than a threshold voltage may be supplied across the selection memory cell CELL. When a voltage higher than a threshold voltage is supplied across the selected memory cell CELL, the selected memory cell CELL may be turned on (S110).

When the memory device operates in the sampling period, the selection switch Ssw, the first switch SW1, and the second switch SW2 may be closed. In this case, the voltage regulator RG may supply the sampling voltage Vsample determined based on the location of the memory cell to the memory cell CELL.

When the sampling voltage Vsample is supplied to the memory cell CELL, the sampling current Isample whose size is adjusted according to the resistance Rdyn of the memory cell may flow through the memory cell CELL. The capacitor C may be charged with the sampling current Isample. The resistance Rdyn of the memory cell may be sampled by detecting the sampling current Isample (S120).

When the selection switch Ssw is opened and the path switch Psw is closed in the programming period after the sampling period, the power supply voltage VPP may be connected to the memory cell. In this case, the first switch SW1 and the second switch SW2 may be opened, and the third to fifth switches SW3 to SW5 may be closed.

The sampling circuit SC may generate additional programming current by discharging the charge charged in the capacitor C. The bias current circuit BC may generate an initial programming current corresponding to the bias current Ibias. Therefore, in the programming period, the memory device may determine the final programming current Icell=Ipgm by adding the additional programming current determined based on the sampling current Isample to the initial programming current. The memory device may supply the final programming current to the selected memory cell (S130).

Figure 20:
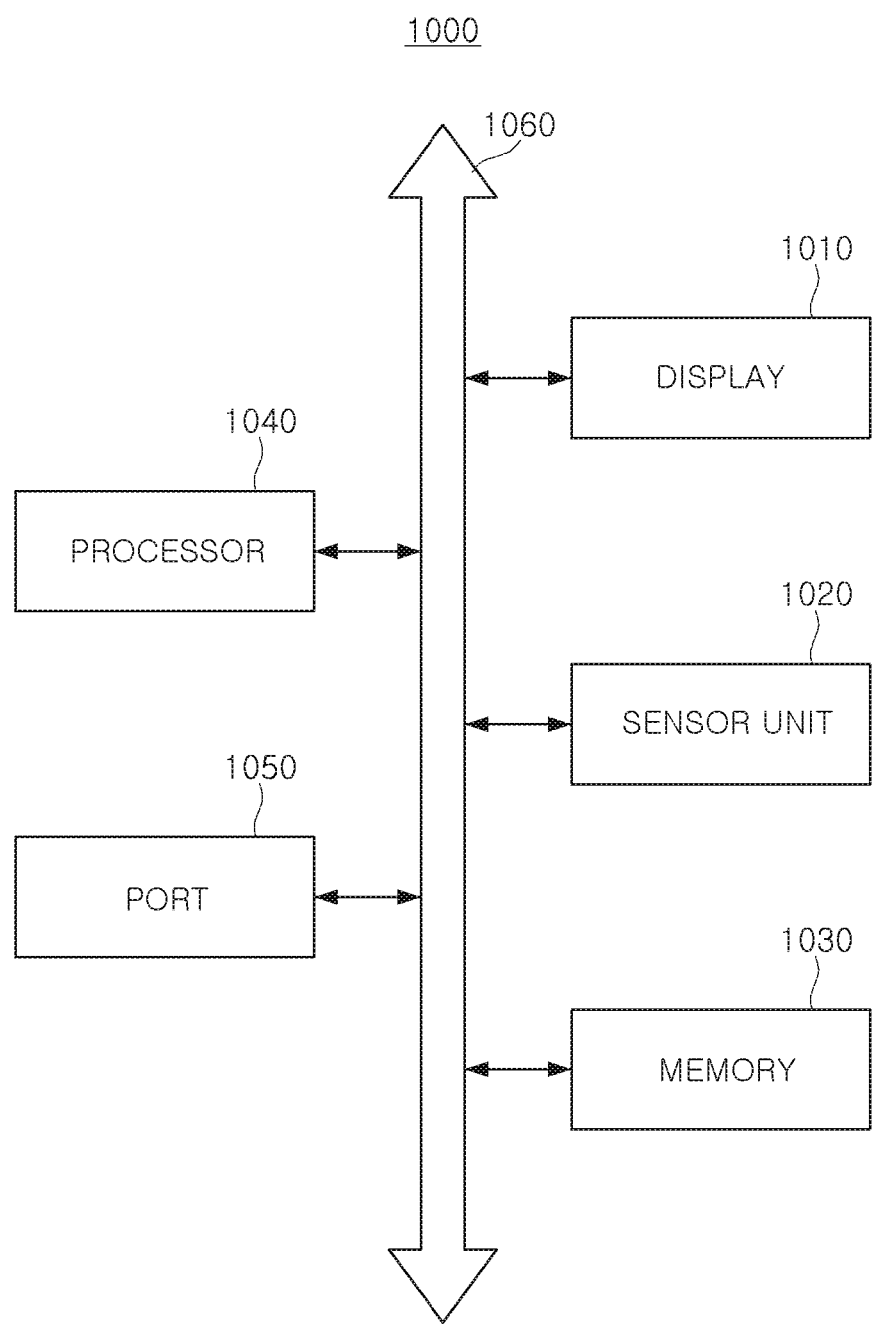
FIG. 20 is a block diagram schematically illustrating an electronic device including a memory device according to an example embodiment.

FIG. 20 is a block diagram schematically illustrating an electronic device including a memory device according to an example embodiment.

A computer apparatus 1000 according to an example embodiment illustrated in FIG. 22 may include a display 1010, a sensor unit 1020, a memory 1030, a processor 1040, a port 1050, and the like. In addition, the computer apparatus 1000 may further include a wired/wireless communication device, a power supply device, and the like. Among the components illustrated in FIG. 21, the port 1050 may be a device provided for the computer apparatus 1000 to communicate with a video card, a sound card, a memory card, a USB device, and the like. The computer apparatus 1000 may be an apparatus encompassing a smartphone, a tablet PC, a smart wearable device, and the like, in addition to a general desktop computer or a laptop computer.

The processor 1040 may perform a specific operation, an instruction, a task, or the like. The processor 1040 may be a central processing unit (CPU) or a microprocessor unit (MCU), a system on a chip (SoC), or the like, and may communicate with other devices connected to the port 1050, as well as the display 1010, the sensor unit 1020 and the memory device 1030 through a bus 1060.

The memory 1030 may be a storage medium that stores data necessary for the operation of the computer apparatus 1000, multimedia data or the like. Examples of the memory 1030 include a volatile memory such as a random access memory (RAM) or a nonvolatile memory such as a flash memory or the like. Other examples of the memory 1030 include at least one of a solid state drive (SSD), a hard disk drive (HDD), and an optical drive (ODD) as a storage device. An input/output unit 1020 may include an input device such as a keyboard, a mouse, and a touch screen provided to a user, and an output device such as a display, an audio output unit and the like.

The memory 1030 may include a phase change memory device that writes/deletes and reads data by using resistance change of a phase change material. In an example embodiment illustrated in FIG. 20, the memory 1030 may include a memory device according to various embodiments described above with reference to FIGS. 1 through 19.

As set forth above, according to an example embodiment, when the memory device programs a selected memory cell, the magnitude of the programming current may be differently determined according to the resistance of the selected memory cell. Therefore, the memory device has an effect of compensating for a change in program characteristics according to the resistance of the selected memory cell during a programming operation.

Also, when the memory device determines the programming current, the memory device may consider the location of the selected memory cell. Therefore, the memory device has an effect of compensating for a change in program characteristics according to the position of the selected memory cell during a programming operation.

While example embodiments have been illustrated and described above, it will be apparent to those skilled in the art that modifications and variations could be made without departing from the scope of the present inventive concept as defined by the appended claims.

What is claimed is:

1. A memory device comprising:
a memory cell array including a plurality of memory cells disposed in locations in which a plurality of word lines and a plurality of bit lines intersect each other;
a decoder circuit configured to determine at least one of the plurality of memory cells to be a selected memory cell in response to an address; and
a program circuit configured to generate a sampling current of which a magnitude decreases as resistance of the selected memory cell increases during a sampling period, and to generate a programming current based on the sampling current during a programming period, in a programming operation for the selected memory cell.

2. The memory device of claim 1, wherein the program circuit supplies a sampling voltage to compensate for a position of the selected memory cell to a selected word line connected to the selected memory cell during a first period of the sampling period.

3. The memory device of claim 2, wherein the program circuit supplies a first voltage, higher than a threshold voltage of the selected memory cell, across opposite ends of the selected memory cell during a second period of the sampling period.

4. The memory device of claim 3, wherein the sampling voltage is lower than the first voltage.

5. The memory device of claim 2, wherein during the programming period, a second voltage is supplied across the selected memory cell.

6. The memory device of claim 5, wherein the sampling voltage is lower than the second voltage.

7. The memory device of claim 1, wherein a magnitude of the programming current decreases as the resistance of the selected memory cell increases.

8. The memory device of claim 1, wherein the program circuit applies a bias current to a selected word line connected to the selection memory cell during the programming period, and generates an initial programming current corresponding to the bias current.

9. The memory device of claim 8, wherein the program circuit generates an additional programming current corresponding to the sampling current during the programming period.

10. The memory device of claim 9, wherein the programming current is a sum of the initial programming current and the additional programming current.

11. A method of operating a memory device, comprising:
turning on a selected memory cell connected to a selected word line and a selected bit line;
detecting a resistance of the selected memory cell;
inputting a bias current to a selected word line connected to the selected memory cell;
generating an initial programming current corresponding to the bias current;
generating a sampling current of which a magnitude decreases as the detected resistance increases during a sampling period; and
programming the selected memory cell using the initial programming current and the sampling current during a programming period.

12. The method of claim 11, wherein the detecting the resistance of the selected memory cell comprises:
supplying a sampling voltage to compensate for a position of the selected memory cell to a selected word line connected to the selected memory cell; and
charging a capacitor using the sampling current flowing through the selected memory cell as the sampling voltage is supplied to the selected memory cell.

13. The method of claim 12, wherein the generating the sampling current comprises discharging the charged capacitor.

14. The method of claim 11, wherein the programming the selected memory cell comprises:
supplying a final programming current, a sum of the initial programming current and the sampling current, to the selected memory cell.

15. The method of claim 14, wherein a magnitude of the final programming current decreases as the resistance of the selected memory cell increases.

16. An electronic device comprising:
at least one memory device; and
at least one processor configured to control the at least one memory device,
wherein the at least one memory device includes:
a memory cell array including a plurality of memory cells disposed in locations in which a plurality of word lines and a plurality of bit lines intersect each other;
a decoder circuit configured to determine at least one of the plurality of memory cells to be a selected memory cell in response to an address; and
a program circuit configured to generate a sampling current of which a magnitude decreases as resistance of the selected memory cell increases during a sampling period, and to generate a programming current based on the sampling current during a programming period, in a programming operation of the selected memory cell.

17. The electronic device of claim 16, wherein the at least one memory device detects a dynamic resistance of the selected memory cell corresponding to the sampling current in the sampling period, and writes, to the selected memory cell, the programming current which is inversely proportional to the dynamic resistance in the programming period.

18. The electronic device of claim 17, wherein the dynamic resistance is sampled by sampling a cell current with an application of a fixed sample voltage, and the cell current is inversely proportional to the dynamic resistance.

19. The electronic device of claim 18, wherein the fixed sample voltage is location compensated according to near or far cells.

20. The electronic device of claim 18, wherein the sample current is less than a reset current of the selected memory cell and more than a hold current of the selected memory cell.

* * * * *